United States Patent
Kim et al.

(10) Patent No.: US 8,936,834 B2
(45) Date of Patent: *Jan. 20, 2015

(54) COMPUTER READABLE MEDIUM FOR HIGH PRESSURE GAS ANNEALING

(71) Applicant: Poongsan Microtec Corporation, Busan (KR)

(72) Inventors: Sang-Shin Kim, Glen Ivy, CA (US); Manuel Scott Rivera, San Jose, CA (US); Suk-Dong Hong, Busan (KR)

(73) Assignee: Poongsan Microtec Corporation, Busan (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/935,434

(22) Filed: Jul. 3, 2013

(65) Prior Publication Data

US 2013/0302916 A1 Nov. 14, 2013

Related U.S. Application Data

(60) Continuation of application No. 12/322,665, filed on Feb. 4, 2009, now Pat. No. 8,481,123, which is a division of application No. 11/351,816, filed on Feb. 10, 2006, now abandoned.

(51) Int. Cl.
*B05D 3/02* (2006.01)
*H01L 21/02* (2006.01)
(Continued)

(52) U.S. Cl.
CPC .............. *H01L 22/12* (2013.01); *H01L 21/324* (2013.01)
USPC ........................................ 427/372.2; 438/795

(58) Field of Classification Search
USPC ................... 427/248.1, 314, 372.2; 438/795
See application file for complete search history.

(56) References Cited

U.S. PATENT DOCUMENTS

| 3,694,962 A | 10/1972 | McDonald et al. |
| 4,018,184 A | 4/1977 | Nagasawa et al. |

(Continued)

FOREIGN PATENT DOCUMENTS

| JP | 05295549 | 11/1993 |
| JP | 11152567 | 6/1999 |

(Continued)

OTHER PUBLICATIONS

"Hazardous Materials Management (HAZMAT)", GSA, U.S. General Services Administration, http://www.gsa.gov/Portal/gsa/ep/contentView.do?noc=T&contentType=GSA_BASIC&c..., Aug. 15, 2008, pp. 1-3.

(Continued)

*Primary Examiner* — Leo B Tentoni
(74) *Attorney, Agent, or Firm* — Blakely, Sokoloff, Taylor & Zafman LLP

(57) ABSTRACT

Novel methods and apparatuses for annealing semiconductor devices in a high pressure gas environment. According to an embodiment, the annealing vessel has a dual chamber structure, and potentially toxic, flammable, or otherwise reactive gas is confined in an inner chamber which is protected by pressures of inert gas contained in the outer chamber. The incoming gas delivery system and exhaust gas venting system are likewise protected by various methods. Embodiments of the present invention can be used, for example, for high-K gate dielectric anneal, post metallization sintering anneal, and forming gas anneal in the semiconductor manufacturing process.

22 Claims, 10 Drawing Sheets

(51) Int. Cl.
  H01L 21/66 (2006.01)
  H01L 21/324 (2006.01)

(56) References Cited

U.S. PATENT DOCUMENTS

| | | | |
|---|---|---|---|
| 4,151,007 | A | 4/1979 | Levinstein et al. |
| 4,154,192 | A | 5/1979 | Tsubouchi et al. |
| 4,167,915 | A | 9/1979 | Toole et al. |
| 4,268,538 | A | 5/1981 | Toole et al. |
| 4,315,479 | A | 2/1982 | Toole et al. |
| 4,427,378 | A | 1/1984 | Bowers |
| 4,911,597 | A | 3/1990 | Maydan et al. |
| 5,151,395 | A | 9/1992 | Tom |
| 5,167,716 | A | 12/1992 | Boitnott et al. |
| 5,167,717 | A | 12/1992 | Boitnott |
| 5,468,937 | A | 11/1995 | Yokogi |
| 5,693,961 | A | 12/1997 | Hamada |
| 5,872,387 | A | 2/1999 | Lyding et al. |
| 5,972,765 | A | 10/1999 | Clark et al. |
| 6,017,806 | A | 1/2000 | Harvey |
| 6,030,457 | A | 2/2000 | Shimazu et al. |
| 6,274,490 | B1 | 8/2001 | Chyan et al. |
| 6,335,232 | B1 | 1/2002 | Ohori et al. |
| 6,527,884 | B1 | 3/2003 | Takakuwa et al. |
| 6,737,361 | B2 | 5/2004 | Yoo |
| 6,737,730 | B1 | 5/2004 | Lane et al. |
| 6,749,763 | B1 | 6/2004 | Imai |
| 6,833,306 | B2 | 12/2004 | Lyding et al. |
| 6,913,961 | B2 | 7/2005 | Hwang |
| 7,713,876 | B2 * | 5/2010 | Suzuki .................. 438/686 |
| 2002/0019149 | A1 | 2/2002 | Tanabe et al. |
| 2003/0173347 | A1 | 9/2003 | Guiver |
| 2004/0069225 | A1 | 4/2004 | Fairbairn et al. |
| 2004/0137755 | A1 | 7/2004 | Herring et al. |
| 2004/0266117 | A1 | 12/2004 | Hwang |
| 2012/0264290 | A1 * | 10/2012 | Reid et al. .................. 438/653 |

FOREIGN PATENT DOCUMENTS

| | | |
|---|---|---|
| JP | 2002329717 | 11/2002 |
| JP | 2004-184923 | 7/2004 |
| JP | 2006080101 | 3/2006 |
| KR | 10-2004-0051658 | 6/2004 |
| KR | 10-2006-0048766 | 5/2006 |

OTHER PUBLICATIONS

"Title 49: Transportation," Electronic Code of Federal Regulations (e-CFR)™, e-CFR Data is current as of Aug. 13, 2008, § 172.303 Prohibited marking. http://ecfr.gpoaccess.gov/cgi/t/text/text-idx?c=ecfr&sid=26289c65094aI6d9c25910bffc89.., Aug. 15, 2008, p. 1.

"Title 49: Transportation," Electronic Code of Federal Regulations (e-CFR)™, e-CFR Data is current as of Aug. 13, 2008, § 172.401 Prohibited labeling. http://ecfr.gpoaccess.gov/cgi/t/text/text-idx?c=ecfr&sid=26289c65094aI6d9c25910bffc89.., Aug. 15, 2008, pp. 1-2.

"Title 49: Transportation," Electronic Code of Federal Regulations (e-CFR)™, e-CFR Data is current as of Aug. 13, 2008, § 172.400 General labeling requirements. http://ecfr.gooaccess.gov/cgi/t/text/text-idx?c-ecfr&sid=26289c65094aI6d9c25910bffc89.., Aug. 15, 2008, pp. 1-2.

"Title 49: Transportation," Electronic Code of Federal Regulations (e-CFR)™, e-CFR Data is current as of Aug. 13, 2008, § 172.521 Dangerous placard. http://ecfr.gpoaccess.gov/cgi/t/text/text-idx?c=ecfr&sid=26289c65094aI6d9c25910bffc89.., Aug. 15, 2008, p. 1.

"Title 49: Transportation," Electronic Code of Federal Regulations (e-CFR)™, e-CFR Data is current as of Aug. 13, 2008, § 172.442 Corrosive label. http://ecfr.gpoaccess.gov/cgi/t/text/text-idx?c=ecfr&sid=26289c65094aI6d9c25910bffc89.., Aug. 15, 2008, p. 1.

"Title 49: Transportation," Electronic Code of Federal Regulations (e-CFR)™, e-CFR Data is current as of Aug. 13, 2008, § 172.558 Corrosive placard. http://ecfr.gpoaccess.gov/cgi/t/text/text-idx?c=acfr&sid=26289c65094aI6d9c25910bffc89.., Aug. 15, 2008, pp. 1-2.

"Title 49: Transportation," Electronic Code of Federal Regulations (e-CFR)™, e-CFR Data is current as of Aug. 13, 2008, § 172.4308 Poison label. http://ecfr.gpoaccess.gov/cgi/t/text/text-idx?c=ecfr&sid=26289c65094aI6d9c25910bffc89.., Aug. 15, 2008, p. 1.

"Title 49: Transportation," Electronic Code of Federal Regulations (e-CFR)™, e-CFR Data is current as of Aug. 13, 2008, § 172.417 Flammable Gas label. http://ecfr.goaccess.gov/cgi/t/text/text-idx?c=ecfr&sid=26289c65094aI6d9c25910bffe89.., Aug. 15, 2008, p. 1.

"Title 49: Transportation," Electronic Code of Federal Regulations (e-CFR)™, e-CFR Data is current as of Aug. 13, 2008, § 172.540 Poison Gas placard. http://ecfr.gpoaccess.gov/cgi/t/text/text-idx?c=ecfr&sid=26289c65094aI6d9c25910bffc89.., Aug. 15, 2008, pp. 1-2.

"All Safety Data Sheets," http://www1.boc.com/uk/sds/all.asp, Sep. 15, 2008, pp. 1-5.

"Safety Data Sheet," Product: Air, MSDS Nr: 599-00-0002BOC(U), Version 1.03, BOC Gases, BOC, Priestley Road, Worsley, Manchester M28 2UT, UK, Aug. 17, 2000, pp. 1-3.

Oxygen (and High Purity Oxygen), Safety Data Sheet, msds nr: 301-00/0003 BOC Version: 2.05, BOC Member of the Linde Group, Apr. 2, 2008, pp. 1-2.

"High Purity Hydrogen," Safety Data Sheet, msds nr: 302-00/0025 BOC Version: 1.02, BOC Member of the Linde Group, Apr. 17, 2002, pp. 1-2.

* cited by examiner

COMPUTER READABLE MEDIUM FOR HIGH PRESSURE GAS ANNEALING

CROSS REFERENCE TO RELATED APPLICATIONS

The present application claims priority from and is a continuation application of U.S. Pat. No. 8,481,123, filed on Feb. 4, 2009, U.S. Pat. No. 8,481,123, is a divisional application of, now abandoned, U.S. patent application Ser. No. 11/351,816, filed on Feb. 10, 2006.

BACKGROUND OF THE INVENTION

1. Field of the Invention

The present invention generally relates to semiconductor manufacturing process. More particularly, the present invention pertains to methods and apparatuses for high pressure gas annealing.

2. Description of the Related Art

During the semiconductor manufacturing process, various different thermal treatments are performed on a semiconductor wafer, for example, during or following oxidation, nitridation, silicidation, ion implants, and chemical vapor deposition processes, to achieve effective reaction with the interface as well as the bulk of the semiconductor wafer. A hydrogen or deuterium passivation process is also a known practice performed at elevated temperature, typically at around 400° C.~500° C.

Key determining factors for effective reaction not only include the process temperature, but also the processing time and the concentration of a particular gas or a mixture of gases used for a particular application or treatment. These three factors are generally considered as independent variables which determine the efficiency of the processing. For example, by increasing the process temperature while keeping the gas concentration constant, the process efficiency will improve. Similarly, by increasing the gas concentration at the same temperature, the process efficiency can be improved. It should be noted that exposure of semiconductor wafers, or more precisely integrated circuits, to excessive heat generally degrades the quality of the integrated circuits, in an irreversible and cumulative way. This is, in part, due to the diffusion of various carriers and ions implanted on the wafer, whose rate increases, typically superlinearly, with temperature. Each integrated circuit has an acceptable limit of total thermal exposure during the whole manufacturing process, which is referred to as the circuit's thermal budget in the related art.

As the technology and device structure approaches the nanometer scale, the limited thermal budget requirement demands higher concentration of the processing gas and/or lower treatment temperature. However, increasing the gas concentration and lowering the processing temperature has its own limitations due to the efficiency problem at lower temperature as well as to the safety problem caused by high concentration gases. Even though, by increasing the processing time without changing the temperature and gas concentration parameters, comparable process efficiency can be achieved, the processing time and the temperature are considered together as a part of the thermal budget limitation. That is, increasing the processing time has a similar (adverse) effect on the device's performance, for example, as elevating the process temperature.

Annealing wafers in a forming gas containing diatomic hydrogen, typically following fabrication but before encapsulation or other packaging steps, has been widely used for repairing various process induced damages during the semiconductor fabrication process as well as for sintering process, which is referred to as hydrogen passivation in the art. The annealing or forming gas generally incorporates approximately 2% to 10% hydrogen ($H_2$) with the remainder being inert gas such as nitrogen ($N_2$). Recently, however, many research reported that pure (100%) hydrogen or deuterium anneal improves the device characteristics and performance such as hot carrier reliability, transistor lifetime, and reduction of dangling bonds and unwanted charge carriers. Improvement of device lifetime increases the transconductance (speed performance) of the device. As the device technology and structure move to the sophistication of the so-called "nanometer technology", new high pressure application technologies require use of other gases such as fluorine ($F_2$), ammonia ($NH_3$), and chlorine ($Cl_2$), which can be highly reactive or toxic. The forming gas (partial pressure) anneal and/or pure $H_2$ or $D_2$ anneal has been generally done at a temperature range above 450° C., and higher temperature tends to result in better performance. However, as the device scale reaches below 0.12 μm range, the limited thermal budget after first metallization requires annealing temperatures at or below 400° C., thus potentially diminishing the hydrogen annealing benefit on semiconductor device performance.

As an alternative, hydrogen or deuterium high pressure anneal has been proposed, and some excellent performance improvement has been reported. Particularly, hydrogen and/or deuterium anneal of high-K gate dielectric device showed significant performance improvement in charge reduction, dangling bond reduction, and increase of transconductance. This finding has been disclosed, for example, in the U.S. Pat. Nos. 6,913,961 and 6,833,306. This improvement is very significant for the manufacturing process of integrated circuit devices using high-K gate dielectric for the next several generations of semiconductor device technology.

One of the main advantages of the high pressure technology is the increase of the reaction rate by effectively increasing the gas concentration at high pressure. By increasing the pressure of the processing gas, the density of the processing gas will increase. The gas density increases roughly linearly as the pressure increases. For example, if pure 100% hydrogen is processed in 5 atm high pressure condition, the actual amount of hydrogen gas that semiconductor silicon is exposed to is 5 times the concentration of the original (100%) hydrogen gas at the atmospheric pressure. In the case of partial pressure conditions, if the hydrogen concentration is 20% and the silicon wafer is processed at 5 atm pressure, then the silicon wafer is effectively exposed to the equivalent of 100% hydrogen at atmospheric pressure. Likewise, processing with 20% hydrogen gas at 20 atm will be roughly equivalent to 4 times of the processing result with the pure (100%) hydrogen gas at 1 atm.

By increasing the pressure of the process gas, it is possible to reduce both the processing temperature and the process time. As the thermal budget limitation reaches the "extreme limit level," and as the device technology reaches the 45 nm range, high pressure processing becomes the only viable solution which meets or exceeds many thermal processing requirements in the semiconductor fabrication technology. The high pressure processing can provide the following benefits with respect to the three aforementioned process parameters; process time reduction, process temperature reduction, and process gas concentration reduction. (1) By increasing pressure, the process temperature can be reduced while maintaining the gas concentration and process time unchanged in order to obtain equivalent or similar process results. (2) By increasing pressure, the process time can be reduced significantly while keeping other parameters of temperature and gas concentration unchanged in order to obtain equivalent or similar process results. (3) By increasing pressure, the process gas concentration can be reduced while maintaining the time and temperature parameters unchanged in order to obtain equivalent or similar process results.

Application of high pressure hydrogen/deuterium process anneal to high-K gate dielectric process anneal, post-metallization sintering anneal, and forming gas anneal in the semiconductor fabrication could achieve a significant improvement in the device performance, for example in terms of increased device lifetime, enhanced transconductance, and reduced number of dangling bonds, and also achieve significant process thermal budget improvement at a given processing temperature and processing time, which is an essential requirement for the advanced device technology.

Although significant performance enhancement of semiconductor device by high pressure anneal, in particular, in the hydrogen ($H_2$) or deuterium ($D_2$) environment, has been known for some time, the semiconductor manufacturing industry has been unable to implement this fabrication technology in the production line. One of the main hindrances has been various safety concerns with existing annealing systems and, in particular, high pressure processing vessels.

Some of the processing gases are highly reactive, inflammable, toxic, or otherwise dangerous, and when these gases are pressurized, the likelihood of leakage of the gas from the pressure vessel or its support subsystems to the atmosphere increases, and the danger becomes far greater. Hydrogen/deuterium gas, for example, is highly inflammable, and when high concentration of hydrogen/deuterium is exposed to oxygen in the atmosphere, it can explode. Furthermore, due to its small molecular size, there is higher likelihood of leakage of hydrogen/deuterium under high pressure conditions. This has resulted in slow development of high pressure $H_2/D_2$ processing vessels in the semiconductor capital equipment industry. The same has been true with usage of other toxic, inflammable, or otherwise dangerous gases in high pressure annealing environment.

A high pressure processing system typically includes the following three main segments or subsystems: (1) A high pressure gas process vessel, (2) an incoming high pressure gas delivery system, and (3) a disposal (venting) mechanism of the high pressure gas after the process completion. Of these, the most important will normally be the process vessel or chamber, where the process gas such as hydrogen is being pressurized and semiconductor wafers are being processed. The door, or cover, of the chamber is typically sealed with O-rings. Under high pressure and high temperature condition, if the O-ring is unable to hold its seal, the process gas such as hydrogen can leak to the atmospheric air. Any other joints in the assembly or defects in the material could also result in leakage of the gas, leading to potentially dangerous situation.

Another safety issue with a high pressure hydrogen tool is the incoming gas control subsystem or module, where flowmeters, mass-flow controllers, and other gas control mechanisms are connected. These connection joints are all potential sources of hydrogen leak, and any weakness or failure at these joints could create a hazardous condition. The stainless steel pipe used to transport the process gas is also a part of the safety concerns. Even though the quality of stainless steel pipe today is generally very high, any defect in the stainless steel itself can result in leak of hydrogen under high pressure conditions.

Another important element to consider in designing high pressure annealing systems is how to exhaust the process gas such as highly pressurized hydrogen or deuterium into the atmosphere when the processing is done. The pressurized hydrogen could be up to 100% in concentration, and could create a safety problem unless it is properly handled. Another safety issue is the load-lock environment where the door of the process chamber opens after the process is completed and gases are depressurized. Even after the process gas is depressurized, there is always a possibility of residual gas being trapped in the chamber, and this residual gas such as hydrogen could interact with the atmospheric air.

Partly due to these safety concerns, even though it has been well known that high pressure hydrogen process is highly beneficial for semiconductor device performance, the capital equipment industry has been reluctant to invest the capital necessary for developing high pressure hydrogen process equipment. Most of the reported high pressure hydrogen processing tools are prototypes used, or tested, only in the laboratory settings, one of which is shown in FIG. 1A. The figure illustrates a cross-sectional view of a typical high pressure hydrogen processing vessel in the prior art. It should be noted that the vessel shown in the figure is a prototype, or a research lab model. This particular design of the high pressure process vessel may not be used in the production environment of the semiconductor fabrication process due to the aforementioned safety issues.

FIG. 1A shows a main processing vessel 10, made of stainless steel in this case, and a vessel cover 11 on top of the vessel. The cover, when closed, is typically sealed with an O-ring (not shown in the figure). Inside the main vessel 10, a heater 20, a reactor vessel 21, and the reactor cover 22 are stacked together to hold a semiconductor wafer (not shown). Through the top vessel cover 11 to the inside of the main vessel 10 are connected $H_2/D_2$ gas injector or inlet 15, a pressure sensor 14, and gas exhausting outlet 16. The main heater is connected with temperature sensor/thermocouple 17 and thermocouple 18, both of which are connected to a temperature controller 12. The pressure sensor 14 is then connected to a pressure monitor unit 13, which is in turn coupled to the temperature controller.

The design of the prototype shown in FIG. 1A does not take into consideration the safety issues mentioned earlier, and this particular model is designed for feasibility study only. It should be noted that this vessel is designed to hold a single wafer only. The system is operated by first mounting a wafer into a reactor vessel 21. The wafer is heated by the heater 20 and the hydrogen gas is introduced from the top through the gas injector 15. The pressure sensor 14 and the pressure monitor unit 13 monitors the gas pressure inside the main chamber, while the thermocouples 17 and 18 monitor the temperature. Once the desired gas pressure and temperature is reached, a typical annealing process lasts about half an hour. After the process is completed, the $H_2$ gas in the chamber is exhausted via the outlet 16.

One of the weakest parts of this design would be the main O-ring used to seal the process chamber or vessel. This is depicted in FIG. 1B, where the main O-ring is explicitly shown. The figure shows a cross-sectional view of a main vessel 110 and its cover 111, as in FIG. 1A. The vessel has a cylindrical shape in this example. Other parts included in FIG. 1A such as incoming gas lines and exhaust pipes are not shown in FIG. 1B for the sake of clarity. In this illustration, the gap between the vessel 110 and the cover 111 is sealed with an O-ring 109. An O-ring has a shape of a circular ring and it typically has a circular or elliptical cross section. The figure shows an O-ring with a rectangular cross section. If this main O-ring gives away to a high pressure, the hydrogen gas can leak out of the vessel and can ignite when exposed to oxygen in the atmosphere. This can create an extremely hazardous condition. Even under normal operating conditions, there is a higher likelihood of leakage of hydrogen around the O-ring.

BRIEF SUMMARY OF THE DESCRIPTION

The present invention relates to annealing systems and other systems which use certain gases at high pressures. In particular, embodiments of the present invention pertain to methods and apparatuses for annealing semiconductor devices in a high pressure gas environment. According to at least one embodiment of the present invention, high pressure hydrogen or deuterium gas is used in various annealing processes, such as high-K gate dielectric process anneal, post-metallization sintering anneal, and forming gas anneal. The use of high pressure gas can significantly improve the device performance. For example, it could increase the device's lifetime and its transconductance, and it can decrease the number of dangling bonds. One of the main advantages of the high pressure gas annealing is that these improvements in the device performance can be achieved with a reduced thermal budget cost at a given temperature and/or a given processing time, which is an essential requirement for the advanced device technology.

In one embodiment of the present invention, a high pressure processing system using a vertical vessel is used for hydrogen/deuterium anneal. In another embodiment, a horizontal processing vessel is employed for high pressure hydrogen/deuterium annealing. According to certain embodiments of the present invention, the annealing vessel has a dual chamber structure, comprising an inner chamber and an outer chamber. In these embodiments, a reactive gas, which may be inflammable, toxic, or otherwise dangerous, is confined in the inner chamber. The inner chamber is then protected by the external pressure exerted by another gas contained in the outer chamber. In some embodiments, inert gas such as nitrogen is used for this purpose. This design provides a type of buffer zone in case there is a leakage of the processing gas from the inner chamber. In certain embodiments, more than one outer chambers are used to provide multiple layers, or buffer zones, of protection. The incoming gas delivery module or subsystem and the exhaust gas venting subsystem are likewise protected by various methods in some embodiments. In at least one embodiment of the present invention, the inner chamber is made of non-metallic material such as quartz, and the outer chamber is made of metals or metallic alloys such as stainless steel. In some embodiments, both chambers are made of metallic materials with high melting points.

In the dual chamber design, the pressures of the gases in the inner and outer chambers are controlled in a coordinated way. For example, when the pressure of the gas in the inner chamber increases, or decreases, the amount of the gas in the outer chamber is increased, or decreased, such that the differential pressure across the inner chamber wall remains in a predetermined range. A pressure difference higher than a certain value can affect the integrity of the inner chamber, which may have lower strength or resistance to the force caused by pressure difference than the outer chamber.

According to an embodiment of the present invention, a method is disclosed for designing and manufacturing high pressure hydrogen, deuterium, and other toxic gas (100% purity or partial pressure) processing systems suitable for high-K gate dielectric anneal, post metallization sintering anneal, and forming gas anneal in the semiconductor fabrication process. The method overcomes many of the major safety problems associated with pressurized hydrogen/deuterium and other inflammable or toxic gases such as fluorine, ammonia, and chloride, and it can significantly improve semiconductor device performance in various aspects such as increased device lifetime, higher transconductance, and dangling bond reduction, etc.

Embodiments of the present invention make the annealing in a high pressure environment possible, or practical, and provide, among other things, benefits in the following way by affecting the three essential process parameters: the process time, the process temperature, and the process gas concentration. (1) The process temperature can be reduced in accordance with the increased pressure, while maintaining the gas concentration and process time unchanged, producing the same or comparable process results. (2) The process time can be reduced significantly in accordance with the increased pressure, while keeping other parameters of temperature and gas concentration unchanged, producing the equivalent process results. (3) The process gas concentration can be reduced in accordance with the increased pressure, while maintaining the time and temperature parameters unchanged, producing similar process results. (4) The process time and process temperature can be simultaneously reduced in accordance with the increased pressure while the concentration of the processing gas is unchanged. (5) The process time, the process temperature, and the gas concentration can be simultaneously reduced in accordance to the increased pressure without affecting the process results. And, (6) the process gas concentration, the process time and process temperature can be substantially reduced or decreased at the same time.

As stated earlier, the main safety concern is a possibility of the gas leakage from the annealing vessel. The likelihood of leakage increases under high pressure conditions. When the hydrogen gas in high concentration is exposed to oxygen in the atmosphere, for example, it can ignite fire or explode. Embodiments of the present invention employ various methods and techniques to prevent hydrogen or other processing gas from releasing directly into the atmosphere, or otherwise reduce the possibility of its exposure to the atmosphere during operations of the annealing system. In particular, methods and techniques are used to minimize gas leakage while delivering and processing the high pressure hydrogen/deuterium and other toxic gas in the annealing vessel or any of the subsystems connected to the vessel. Embodiments of the present invention can be used in the production environment.

The present invention provides an improved processing vessel, where hydrogen is being pressurized and wafers are being processed. The vessel or chamber has one or more openings for installing various electronics and chamber components, and O-rings of appropriate sizes are used to seal between the chamber and its doors or covers. Under high pressure conditions and/or under extreme thermal conditions, if an O-ring is unable to hold its seal, hydrogen may leak into the atmospheric air leading to potentially dangerous situation. In general, there is a higher likelihood of leakage of hydrogen around O-rings or near any assembly joints. Small molecules such as hydrogen can even permeate through any defects or imperfections in the solid metallic material of the chamber. According to at least one embodiment of the present invention, the process vessel comprises an inner chamber and an outer chamber. Hydrogen or other reactive gas is then confined in the inner chamber, which is protected by the external pressure exerted by another gas contained in the outer chamber. This embodiment provides a buffer layer in case there is a leakage of the processing gas, which may be highly reactive, inflammable, toxic, or otherwise dangerous or harmful to people when directly exposed to the atmosphere. Inert gas such as nitrogen can be used in the outer chamber, and it provides, among other things, two main functions: It dilutes the potentially dangerous gas leaked from the inner chamber, and it prevents the leaked gas from directly releasing into the air. According to one embodiment, the vessel uses two vertical chambers, one enclosing the other. According to another embodiment, the vessel comprises two or more horizontal chambers. In other embodiments, various combinations of different types of chambers are used, with one chamber used for processing and the other chambers for containing the processing chamber, either directly or indirectly.

Some embodiments of the present invention also provide safe incoming gas injection, delivery, and control subsystems or modules, where flow-meters, mass-flow controllers, and other gas control mechanisms are connected. In one embodiment, the connection joints between these units are protected by additional compartments or cabinets. In another embodiment, the gas pipe is protected by double wall construction. In some embodiments, a warning or alarm system is utilized to detect any gas leakage from these subsystems, including the processing vessel and the gas pipes connecting these subsystems.

In another aspect of the present invention, a safe venting system is provided, where the pressurized hydrogen, which could be up to 100% pure, is released into the atmosphere after the annealing process. In some embodiments, the hydrogen gas is diluted by another gas during the exhaust process. According to one embodiment, the gas from the outer chamber is released at the same time and mixed with the hydrogen/deuterium gas or other toxic or inflammable gas from the inner chamber. According to another embodiment, other inert gas such as nitrogen is added during the venting process thereby further reducing the concentration of the reactive gas exhausted from the annealing vessel.

After the process is completed and the gases used for various purposes are depressurized, there may still remain some residual gas trapped in the annealing chamber or in any of the subsystems. The residual gas trapped can eventually leak and/or interact with the atmospheric air creating potentially dangerous situation. According to at least one embodiment of the present invention, a method and apparatus is provided to safely remove the residual gas remaining in the system after the process is completed, or otherwise terminated. In some embodiments, this is accomplished by using a design which utilizes extra nitrogen flow near, or around, the exhaust valves or pipes of the annealing vessel.

Therefore, as summarized herein, the present invention provides, among other things, a design of high pressure pure or partial pressure $H_2$, $D_2$, and other toxic gas (e.g., $F_2$, $NH_3$, $Cl_2$) annealing vessels and other processing subsystems which overcome many of the safety problems associated with the existing systems. The present invention provides one of the first high pressure annealing systems using pure hydrogen/deuterium or a forming gas which can be deployed in the production environment of the semiconductor fabrication process. Embodiments of the present invention can be used, for example, for high-K gate dielectric anneal, post metallization sintering anneal, and forming gas anneal in the semiconductor manufacturing process. These and other embodiments, features, aspects, and advantages of the present invention will be apparent from the accompanying drawings and from the detailed description and appended claims which follow.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1A:
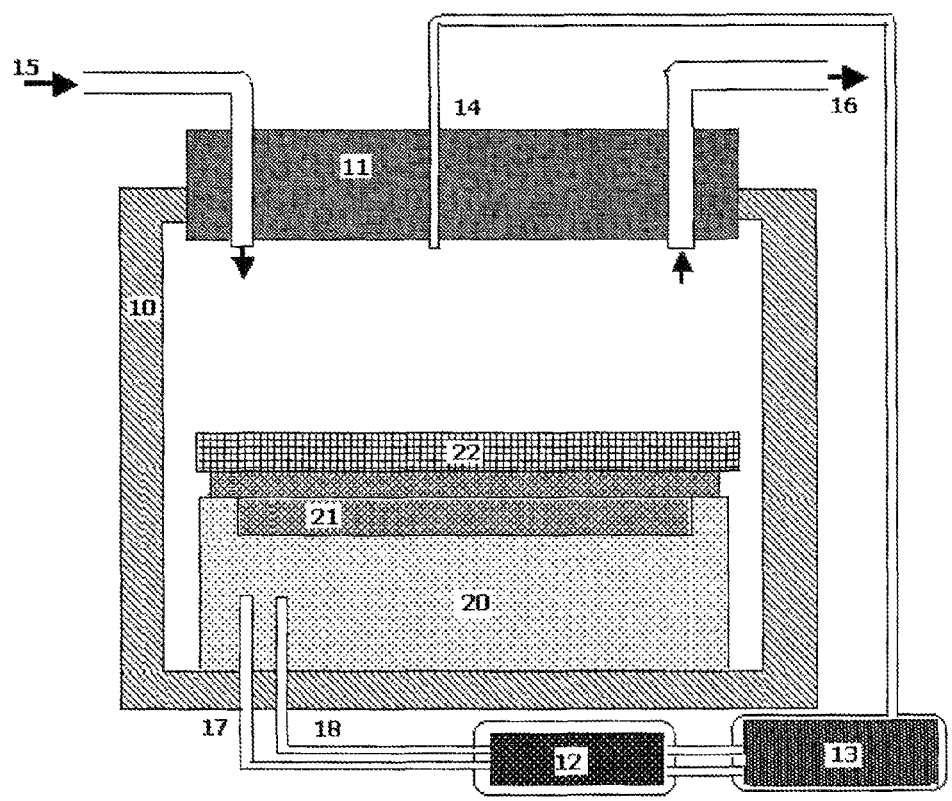
FIG. 1A depicts a cross-sectional view of a high pressure annealing apparatus in the prior art. It comprises a gas chamber, a gas delivery system, and a gas exhaust system.

The present invention will now be described more fully hereinafter with reference to the accompanying drawings, in which various exemplary embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art Likewise, for purposes of explanation, numerous specific details are set forth in the following description in order to provide a thorough understanding of the present invention. It will be evident, however, to one skilled in the art that the present invention may be practiced without these specific details.

One of the fundamental requirements in designing high pressure processing vessels using hydrogen or other hazardous gas is to ensure the safety. Under a controlled environment, the diatomic hydrogen or deuterium gas is relatively safe. However, concentrated hydrogen/deuterium is highly inflammable and, when exposed to the atmospheric air or oxygen, it can ignite or explode. The risk grows as the amount of hydrogen/deuterium present in the air increases. The amount of gas molecules in a given volume of space increases roughly in proportion to its pressure, and hence the risk of explosion or sudden inflammation of hydrogen increases as the gas is more pressurized. At the atmospheric pressure, a hydrogen concentration of 7% or higher poses a significant safety concern. Under an elevated pressure condition, the safety concern magnifies, with the gas density roughly linearly proportional to the pressure. As stated earlier, this safety concern is one of the primary reasons that the semiconductor capital equipment industry has been reluctant to pursue designing and manufacturing of a high pressure hydrogen/deuterium processing vessel that can be used in a production environment. One of the most important design considerations is, therefore, to provide a safe controlled environment in which the processing gas is confined and to reduce or minimize the possibility of the leakage or exposure of the processing gas into the atmosphere.

The design of high pressure processing systems using hydrogen (and any other gas) will typically include three important segments or subsystems: (1) a main process vessel; (2) an incoming high pressure hydrogen gas delivery and control system; and (3) a disposal, or venting, mechanism to exhaust the high pressure hydrogen gas after the process completes. Various aspects of the present invention will now be discussed with regards to these three subsystems. Even though the hydrogen gas is mainly used as an exemplary processing gas in the following description, this should not be construed as limiting to the hydrogen gas only. In many cases, unless stated otherwise, any reactive, inflammable, toxic, harmful, or otherwise dangerous gas, or in general, any gas, can be substituted for "hydrogen" in various embodiments of the present invention.

Figure 1B:
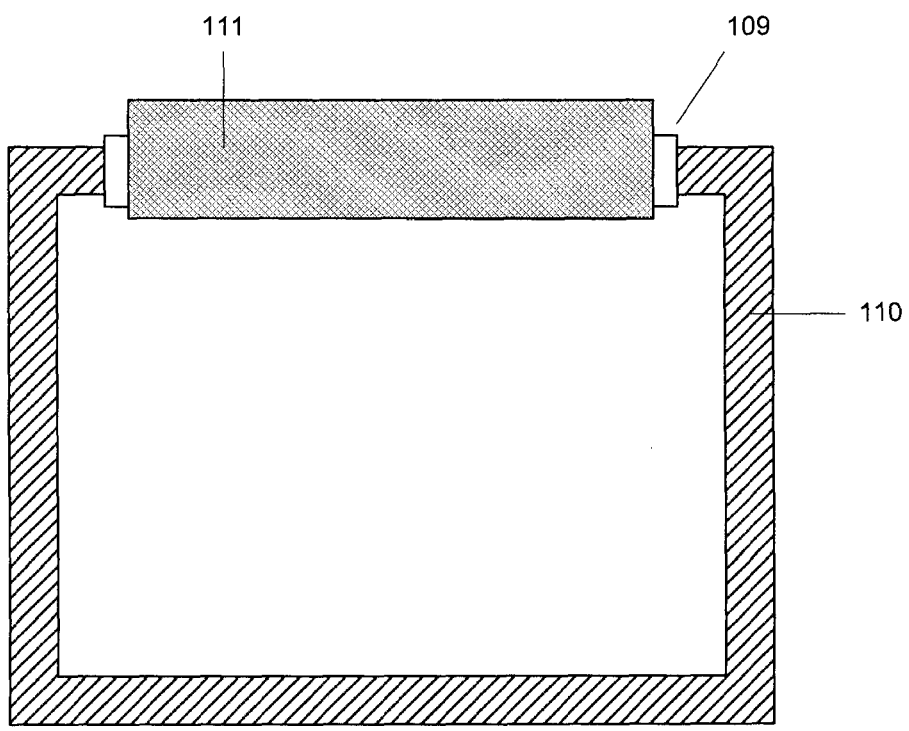
FIG. 1B depicts a high pressure processing vessel in the prior art. It shows a cross-sectional view of an O-ring used to seal the gap between the chamber and its cover.

First of all, the present invention provides an improved annealing vessel, where hydrogen is being pressurized and wafers are being processed. The vessel is typically enclosed by O-rings to seal between the chamber and its door, as shown in FIG. 1B. In a typical vessel in the prior art, if the O-ring is unable to hold its seal under high pressure, the hydrogen gas may leak from the vessel directly to the outside, which can create potentially dangerous situation. According to at least one embodiment of the present invention, the process vessel comprises a dual chamber having an inner chamber and an outer chamber. Hydrogen or other reactive gas is then confined in the inner chamber, which is protected by the external pressure exerted by another gas contained in the outer chamber. This embodiment provides a buffer in case there is a leakage of the inner gas. According to one embodiment, the vessel uses two vertical chambers, one enclosing the other. According to another embodiment, the vessel comprises two horizontal chambers, again one enclosing the other. In certain embodiments, more than two chambers are used.

Second, according to some embodiments of the present invention, an improved incoming gas delivery and control subsystem or module is provided, where flow-meters, mass-flow controllers, and other gas control mechanisms are connected. In at least one embodiment, various gas controller units as well as the connection joints between these units are protected by additional compartments or chambers. When the processing gas leaks from any of the units, the leaked gas will be confined in the protective compartments. In some embodiments, a warning or alarm system is triggered when the gas leak is detected. Leaks from the gas pipe is also prevented, or reduced, in certain embodiments, by using stainless steel pipes with double walls or layers.

Third, according to one aspect of the present invention, an improved gas disposal, or venting, system is provided, where the pressurized hydrogen gas is released into the atmosphere after the annealing process is completed. In some embodiments, the hydrogen gas is diluted by another gas during the exhaust process. According to one embodiment of the present invention, the gas from the outer chamber is released at the same time and mixed with the hydrogen gas or other toxic or inflammable gas from the inner chamber. In some embodiments, the volume of the outer chamber is bigger than that of the inner chamber, and hence it dilutes the processing gas more effectively. In one embodiment, the volume of the outer chamber is three times that of the inner chamber. In some embodiments, other inert gas is added into the exhaust pipe during the venting process to reduce the concentration of the reactive gas exhausted from the annealing vessel. After the process is completed and the gases are depressurized, there may remain some residual gas in the annealing vessel or in any of the subsystems. The residual gas can eventually leak and/or interact with the atmospheric air creating potentially dangerous situation. According to an embodiment of the present invention, a method and apparatus is provided to safely remove the residual gas remaining in the system after the process is completed.

Before we describe in detail various embodiments of the present invention with reference to accompanying figures, some of the main features of various exemplary embodiments are summarized first.

The present invention provides a method, and an apparatus thereof, to design and manufacture hydrogen/deuterium and toxic gas high pressure processing equipments (up to 100 atm) for high-K gate dielectric anneal, post-metallization sintering anneal, forming gas anneal, and other process applications in the semiconductor fabrication environment.

The present invention provides a design of dual pressure mechanism to isolate the high pressure hydrogen (tube pressure) from the atmosphere by using high pressure nitrogen environment (shell pressure) in order to ensure the safety of the inner, or process, chamber. The tube pressure is the pressure of the process gas such as hydrogen/deuterium or other toxic gas in the inner chamber, or tube, and the shell pressure is that of nitrogen or other inert gas in the outer chamber, or shell. A quartz chamber is used for the inner chamber, in some embodiments, to separate the shell pressure from the tube pressure.

The present invention provides a method, and an apparatus thereof, to dilute the tube pressure hydrogen with the shell pressure nitrogen during the de-pressurization (venting) of the process chamber after the process completes and/or in the case of emergency process abort. In some embodiments, additional dilution is used in the exhausting vent line or dilution tank in order to further dilute hydrogen/deuterium or other toxic gas. In some cases, the exhaust gas is burnt in the scrubber, if necessary, prior to releasing into the atmosphere to ensure safety.

Embodiments of the present invention provide safety in the gas control subsystem under high pressure condition by designing the sealed gas control panel subsystem either under vacuum and/or under nitrogen pressure and providing hydrogen and/or deuterium sensors inside the gas panel in order to detect any hydrogen/deuterium leak from any connections or joints.

Embodiments of the present invention provide safety in the atmospheric environment by installing double-walled stainless steel pipe for high pressure process gas ($H_2/D_2$ or $F_2$, $NH_3$, $Cl_2$, etc.) flow lines between the gas source (pressurized gas canister or booster pump) to the sealed gas control panel and between the sealed gas control panel and the process chamber of the high pressure vessel. In some embodiments, double-walled stainless steel pipe is also installed between the process chamber and exhausting unit for venting the process gas. Double-walled stainless steel pipe prevents hydrogen from leaking directly into the atmosphere by having the second pipe outside the inner gas pipe.

Embodiments of the present invention ensure safety in the processing load-zone area by providing nitrogen lateral laminar flow through the exhaust to remove any potential residue of hydrogen or deuterium when the vessel door is open after the process completion. In some embodiments, the nitrogen gas with the exhaust flows directly to the dilution tank, where the exhaust gas is mixed with other gas and further diluted.

Figure 2A:
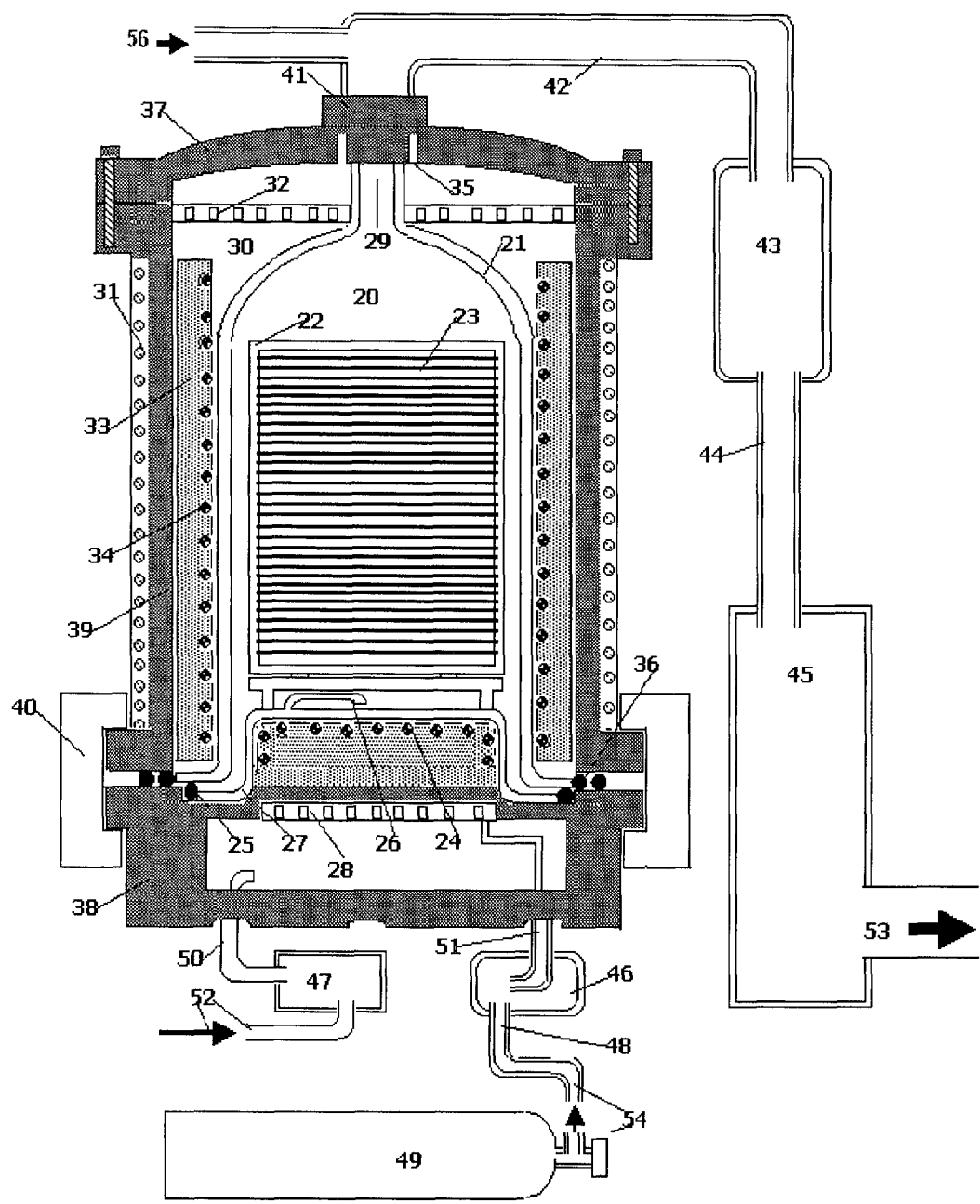
FIG. 2A shows an exemplary embodiment of the present invention. The embodiment uses a vertical high pressure gas chamber, and it further comprises an incoming gas delivery system and a gas exhaust/venting system. It also includes a burning scrubber.

With reference now to FIG. 2A, an exemplary embodiment of the present invention comprising the aforementioned three subsystems is illustrated. In this embodiment, a vertical high pressure processing system is used. According to this exemplary embodiment, the annealing vessel has a dual chamber structure, comprising an inner chamber and an outer chamber, and a reactive gas, which may be inflammable, toxic, or otherwise dangerous, is confined in the inner chamber. The inner chamber is then protected by the external pressure exerted by another gas contained in the outer chamber. This design provides a buffer zone in case where there is a leakage of the processing gas from the inner processing chamber, and hence it provides, among other things, two main benefits: It dilutes the potentially dangerous gas leaked from the inner chamber, and it prevents the leaked gas from directly releasing into the air. In certain embodiments, more than one outer chambers are used to provide multiple layers, or buffer zones, of protection. The main external vessel, or the outer chamber, shown in the figure comprises three components, top 37, body 39, and bottom 38. In some embodiments, these external vessel components are made of type 316 stainless steel material that has high stress point to pressure. The vessel top 37 is normally attached to the main vessel body 39 by screws, and the vessel bottom 38 is attached to the main vessel 39 using a breech door locking 40, which is also made of type 316 stainless steel in some embodiments. In this exemplary design, the vessel bottom is separated from the main vessel when the vessel door opens for loading and unloading.

Inside the main vessel, there is a 4-zone main heater 34 that controls each heater zone independently. The heater elements 34 are insulated from the vessel wall by an insulator 33. There is also a 2-zone plug heater 24 on top of the bottom component of the vessel 38 in this embodiment, which can heat the wafer holder or wafer boat 22 from the bottom. The wafer boat holds one or more semiconductor wafers 23, and in some embodiments, it is made of quartz. The external main vessel has cooling water lines 31 to prevent the vessel from overheating by the heater 34 inside the vessel beyond the safety temperature. Around the plug heater 24, quartz cap 27 is placed, and it has quartz helix around the plug heater that will heat the incoming process gas to the process temperature. The process gas is introduced into the inner processing chamber, or tube, 21 via a gas injector 26, which pressurizes the tube. In some embodiments, the inner process chamber is made of non-metallic materials such as quartz and the outer chamber is made of metals or metallic alloys such as stainless steel. In other embodiments, both chambers are made of metallic materials with high melting points. The inner chamber 21 divides the space in the vessel into two regions, and the gases in these two regions can be completely isolated and they can have different pressures. The gas pressure inside the process chamber, indicated as 20 in the figure, is called a tube pressure and the pressure outside the inner chamber, indicated as 30 in the figure, is called a shell pressure. The outer shell chamber is pressurized by gas typically different from the processing gas, which may be highly reactive, inflammable, or otherwise dangerous. In some embodiments inert gas such as nitrogen is used for this purpose. Nitrogen is introduced into the outer chamber via a shell nitrogen injector 50 in the exemplary embodiment shown in the figure. The figure also shows two chill plates, top 32 and bottom 28, which are used to protect components in the temperature protected areas above the top chill plate 32 and below the bottom chill plate 28 from excessive heat. The shell pressure area inside the outer chamber and the tube pressure area inside the processing chamber are separated and sealed by O-rings 25. O-rings 36 are also used to hold the shell pressure by preventing the inert shell gas from leaking from the main vessel to the outside atmosphere.

In the dual chamber design, the tube pressure and the shell pressure are controlled in a coordinated way. For example, when the pressure of the processing gas (e.g. $H_2$) in the tube increases, or decreases, the amount of the inert gas in the shell is automatically increased, or decreased, by an automatic gas control system, which monitors the tube pressure and the shell pressure and controls the difference in pressure, such that the differential pressure across the inner chamber wall remains in a predetermined range. When pressurizing the chambers, the pressure increases in the shell chamber and in the tube chamber need to be balanced and they should be more or less equal to each other at substantially all times. In certain embodiments using quartz tubes, typically no more than ±2 atm difference between the shell pressure and the tube pressure is tolerable. When the tube is to be pressurized and hydrogen or deuterium gas starts to flow in, the shell nitrogen gas is simultaneously injected into the shell in a manner to maintain the pressure difference within a desired range (e.g. ±2 atm). In a typical design of dual chamber systems, the inflow of the shell nitrogen is generally larger than the hydrogen or deuterium inflow because the outer shell chamber, 39 in FIG. 2A, is typically much larger than the inner tube chamber, 21 in the figure. Similarly, when the hydrogen gas is vented (e.g. after processing is completed), the nitrogen and hydrogen are released concurrently in such a manner to maintain the pressure difference within a desired range.

Equalizing, or near-equalizing, pressures of the shell nitrogen 30 and the tube hydrogen 20 will maintain the integrity of the quartz tube from collapsing, either inward or outward. When the tube is fully pressurized by hydrogen/deuterium or other processing gas to the designated pressure level, the shell is also pressurized by nitrogen or other inert gas to the same or comparable pressure level. The difference between the shell and tube pressures (differential pressure) could be roughly up to 2 atm higher or lower in the shell or up to 2 atm higher or lower in the tube, in a particular design shown in FIG. 2A using particular dimensions (not specified in the figure). Under this condition, the hydrogen or deuterium under high pressure is completely isolated from the atmosphere by a large quantity of nitrogen all around the tube area, thus preventing any exposure of hydrogen/deuterium to the atmospheric air during the high pressure processing.

When the high pressure processing is completed, the tube pressure 20 will be released via de-pressurizing exhaust 29, and the shell pressure 30 will be released via shell pressure exhaust 35, which are controlled by a pressure control valve 41. In this embodiment of FIG. 2A, both the shell pressure and the tube pressure is controlled by the same pressure control valve or a set of valves. When the pressure control valve 41 releases the pressure, the nitrogen in the shell and hydrogen or other process gas in the tube are simultaneously released to the exhaust. The exhaust gases are mixed, and this effectively dilutes the processing gas such as hydrogen with nitrogen and also maintains the pressure differential between the two chambers within a desired range. In the exemplary embodiment shown in the figure, where the volume of the outer chamber is three times that of the inner chamber, the concentration of the processing gas from the inner chamber becomes diluted to the one-third level of its original concentration. For example, when a forming gas with 30% hydrogen has been used during the annealing, the hydrogen concentration in the exhaust will be around 10%.

During the high pressure processing operation, any hydrogen or other processing gas leak from the tube to the shell will be immediately diluted by surrounding nitrogen in the shell. In a case when the leak from tube to shell is large enough, while the leak from shell to tube is relatively small, the tube pressure will decrease below the desired pressure range. In such a case, the high pressure process will be aborted by software interlock in some embodiments. On the other hand, any nitrogen leak from the shell to the tube will be also mixed with hydrogen (or other processing gas) inside the tube. This will result in dilution of the hydrogen (or other gas) concentration. When the leak is high enough to drop the shell pressure below a desired level, while the tube pressure remaining relatively high, the interlock will also abort the run in some embodiments. When aborting the run, the pressure control valve 41 releases gases from both chambers, thus releasing both the shell pressure and the tube pressure simultaneously. When the leak from the shell to the atmosphere occurs, the shell pressure may drop rapidly, while the pressure in the tube is stable. In this case, the interlock will shut down the process and abort the run in some embodiments. When both the shell pressure and the tube pressure are simultaneously dropping, it means that gases from both the inner and outer chambers are leaking to the atmosphere. Or, when the quartz tube separating the tube pressure and the shell pressure collapses, for example, due to the pressure differential malfunctioning, the hydrogen (or other processing gas) is mixed and diluted with shell nitrogen immediately, thereby reducing the risk. Under such conditions, both the mechanical and software interlocks will shut down the operation and the pressure release valve opens immediately to reduce pressures from both chambers. It will be appreciated that pressure sensors within both the inner and outer chambers may be coupled to a computer which provides the control described herein, and this control may be implemented through a software program executing on the computer.

When the pressure control valve 41 opens, the pressures of both chambers are simultaneously released while the gases of nitrogen and hydrogen are still under high pressure. Hydrogen, though diluted by nitrogen from the shell, should not be exposed to the atmosphere. Any defects in the exhaust pipe, typically made of stainless steel, will release hydrogen into the atmosphere. In order to prevent such unwanted leak from defects in the stainless steel pipe, the exhaust line stainless steel pipe, 42 in FIG. 2A, is made of double-walled stainless steel in some embodiments of the present invention. In the double-walled stainless steel construction, if the first or inner gas pipe experiences a defect and the gas leaks, the second or external protective pipe will contain any leaked hydrogen in the pipe. Thus the likelihood of the gas leak directly into the atmosphere is significantly reduced. The hydrogen, diluted by the shell nitrogen, flows to the dilution tank 43 via the double-walled exhaust line 42 to be further diluted prior to moving to the hydrogen/deuterium burning scrubber 45 via another double-walled stainless steel line 44. After the scrubber burns the hydrogen and any inflammable gas in the exhaust, it will release the burnt residue into the atmosphere, indicated by the arrow 53 in the figure. The exhaust vent line will most likely have water condensation inside the line, particularly if the scrubber is not used, due to the back streaming air from the atmosphere, which typically has much lower temperature than the exhaust gas. The condensation may react with hydrogen since water ($H_2O$) contains oxygen. This could be a source of safety problem. In order to prevent the water condensation and also to increase dilution of venting hydrogen/deuterium, additional nitrogen is injected in the exhaust vent line in some embodiments. FIG. 2A shows a nitrogen injection line 56, which is connected to the exhaust vent line immediately after the exhaust vent valve, and this injection line 56 serves as a constant source of nitrogen to guarantee a constant overflow of a gas from the outlet of the scrubber 45. According to at least one embodiment of the present invention, low flow of nitrogen is maintained during the normal operation in order to prevent any condensation in the vent line and to maintain an always outward flow of nitrogen from the scrubber 45. During the chamber depressurization, the nitrogen flow may be increased in order to further dilute the venting hydrogen/deuterium or any other potentially dangerous processing gas exhausted from the annealing vessel.

FIG. 2A also shows a high pressure canister (bottle) 49 or a booster pump, which is the source of the processing gas such as hydrogen. The incoming processing gas flows into the gas control panel or cabinet 46 through gas lines 54 and 48, and it is injected into the processing chamber 21 through gas pipe 51 and through the gas injector 26 (the gas line between the pipe 51 and the injector 26 is not explicitly shown in the figure). The incoming hydrogen or deuterium gas may be 100% pure, and the pressure is typically 500 PSI at minimum, and hence the incoming gas lines, for example, 54, 48, and 51, and various parts around the gas canister or pump can be one of the most dangerous areas in the high pressure system. The hydrogen gas lines need to be connected to the gas control mechanism such as mass-flow controllers or flow meters (contained in the gas cabinet 46) in order to control the flow. The gas connection joints and the gas control components themselves may be a source of hydrogen gas leak under high pressure. Therefore, all the incoming gas lines, 54, 48, and 51, use double-walled stainless steel pipes, in some embodiments, in order to prevent, or reduce, any hydrogen leak to the atmosphere. Furthermore, according to at least one embodiment of the present invention, the hydrogen or deuterium gas control panel 46 is separated from other gas panels such as the one used for nitrogen 47. The gas control panel in this design is sealed under pressurized nitrogen environment or under light vacuum environment. The $H_2/D_2$ gas panel, where all the gas control components (not shown in the figure) are installed, needs to be sealed in general, and in some embodiments, a $H_2/D_2$ detector sensor is installed inside the control panel. The control panel may also be connected to the dilution tank 43. When any hydrogen leak is detected inside the control panel, the exhaust will open, and an alarm will sound and the source gas line will be shut off. According to an embodiment of the present invention, other gas lines such as $N_2$ or $O_2$ gas pipes use single walled stainless steel pipes. For example, the shell nitrogen lines, 52 and 50, from the nitrogen gas source of dewar or booster pump are single-walled pipes as shown in the figure.

In general, embodiments of the present invention can be practiced with many different types of processing gases, including pure hydrogen or deuterium as stated earlier. In some embodiments, mixture of gases of two or more types with certain concentration ratios may be used. In some other embodiments, the inventive system may have more than one gas canisters 49, or other processing gas sources, and a gas mixture of a predetermined concentration ratio may be produced in the gas injection system (e.g. 46, 48, and 51 in FIG. 2A). In some cases, gas mixture of 10% $H_2$ and 90% $N_2$ (i.e., forming gas) may be used as a processing gas (e.g., in the gas canister 49). In some other cases, gas mixture of 5% $H_2$ and 95% $N_2$ may be used. In yet other cases, 2% of $F_2$ or $Cl_2$ and 98% $N_2$ may be used. In certain embodiments of the present invention, forming gas with 2%~98% of deuterium mixed with other inert gas such as helium, nitrogen, or argon may be used for processing. In some embodiments, the deuterium concentration may be between 1% and 99%, with the rest being an inert gas. Therefore, the present invention is not limited to any particular processing gases, and any type of gas may be used based on application requirements.

Another area of potential hydrogen exposure to the atmosphere in the typical processing vessel design is the load zone of the vessel. When the breech door lock, 40 in FIG. 2A, unlocks the door and the vessel door is open after the process is completed, there is a potential that some trapped residual hydrogen can be released to the atmosphere in the load zone. In order to minimize any potential risk of hydrogen exposure, the load zone is configured with horizontal nitrogen laminar flow from one direction, in some embodiments of the present invention. According to at least one embodiment, the processing gas injection mechanism (e.g., 26 and/or 46 in FIG. 2A) is reused for this purpose. In this case, once the processing gas is switched off, the purging nitrogen or other inert gas from a different gas source such as a nitrogen gas canister or gas pump (not shown in the figure) can be injected into the vessel through the injector 26. (Note that the purging gas lines are not explicitly shown in the figure.) The load zone is also configured with scavenger or exhaust that is connected to the dilution tank 43, thus evacuating any hydrogen residue to the dilution tank. In addition, according to some embodiments, the load zone will include the $H_2/D_2$ detector sensor in order to monitor any hydrogen leaks.

There is also a strong possibility to trap atmospheric air inside the tube chamber as well as inside the shell chamber when the process vessel door is closed, and this may cause an interaction with hydrogen when the pressurization starts. As mentioned above, there is also a possibility of trapping hydrogen inside the chambers when the vessel door is open, at the end of the high pressure process, which may react with oxygen in the atmosphere. In order to prevent such unwanted residue reaction, certain embodiments of the present invention utilizes process recipes which can provide the nitrogen purging processes at the beginning of the process after the vessel door is closed prior to starting the hydrogen pressurization, and at the end of the process prior to opening the vessel door in order to purge any trapped hydrogen both in the shell and the tube.

The embodiment shown in FIG. 2A uses two vertical chambers, one enclosing the other. According to certain other embodiments, the vessel comprises two or more horizontal chambers. In yet other embodiments, various combinations of different types of chambers are used, with one or more chambers used for processing and the other chambers for containing the processing chambers, either directly or indirectly. One such example is shown in FIG. 2B, where a dual chamber high pressure processing vessel comprises an inner horizontal chamber, or tube, and an outer horizontal chamber, or shell.

Figure 2B:
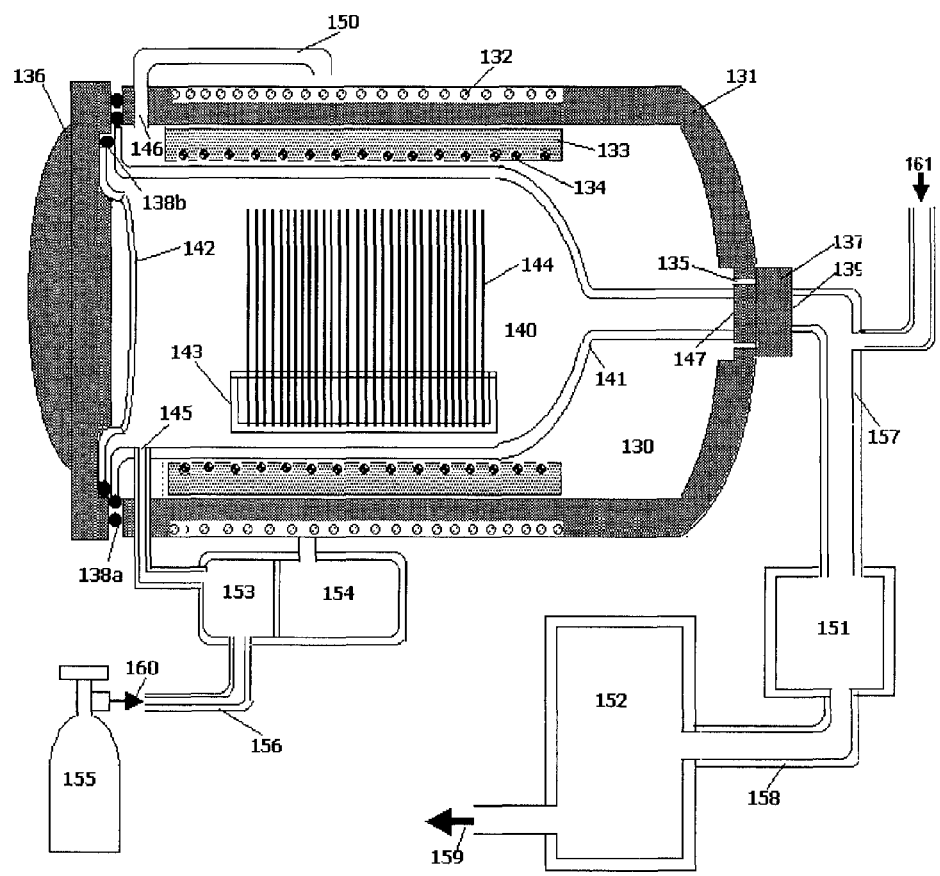
FIG. 2B shows a horizontal high pressure annealing vessel according to an embodiment of the present invention, which comprises an inner processing chamber and an outer protective chamber.

The exemplary high pressure processing system of FIG. 2B comprises three main subsystems, as with the embodiment shown in FIG. 2A, namely, the main processing vessel, the incoming gas injection and control system, and the gas exhaust/venting system. The main vessel component comprises the shell, or outer chamber, which includes the body 131 and the vessel bottom, or door, 136, and the tube, or inner chamber, 141. In this embodiment, the outer chamber is made of type 316 stainless steel material which has high stress point to pressure, and the inner chamber is made of quartz. The vessel door 136 is detached from the main vessel 131 when the vessel door opens for loading and unloading. One or more O-Rings 138a are used to seal the gap between these two components and hold the pressure in the shell. Hydrogen or other processing gas can potentially leak around this load zone into the atmosphere. When the main door 136 unlocks the door and the vessel door is open after the process is completed, there is also a potential that some trapped residual hydrogen can be released to the atmosphere. In order to minimize any potential risk of hydrogen exposure, the load zone is configured with nitrogen laminar flow from one direction, and it is also configured with scavenger or exhaust that is connected to a dilution tank 151. In addition, the load zone may include the $H_2/D_2$ sensor, in certain embodiments, in order to monitor any hydrogen leaks.

In the design of a vertical dual chamber vessel, the inner chamber, or tube, separates the main vessel into two separate regions, each of which contains a different gas and maintains a different pressure. According to some embodiments, the pressure of the inner processing gas, the tube pressure, 140, and the inert gas pressure in the outer chamber, the shell pressure, 130, are controlled together so that they remain within a predetermined range. In some cases, the differential pressure is maintained within ±2 atm difference, for example. The shell chamber 131 is pressurized by nitrogen introduced via shell nitrogen injector 146 connected to the nitrogen gas line 150, and the tube chamber 141 is pressurized by incoming hydrogen or deuterium introduced via a gas injector 145. FIG. 2B also shows one or more semiconductor wafers 144 loaded vertically in the wafer boat 143 placed inside the quartz tube 141. The inner chamber also comprises a vessel door end cap 142. The shell pressure 130 and the tube pressure 140 are sealed by O-Rings 138b, in this embodiment, as in the example of FIG. 2A. The external main vessel has cooling water lines 132 to shield the vessel from the heat from the heater 134 inside the vessel. The 4-zone main heater also includes an insulator layer 133. Each heater can be controlled independently.

When the high pressure processing is completed, the pressure control valve 137 releases the built-up pressure inside the vessel by releasing the exhaust gas from both chambers. The tube pressure will be released via de-pressurizing exhaust 147 and the shell pressure will be released via shell pressure exhaust 135. When the pressure control valve releases the pressure, the nitrogen in the shell and hydrogen in the tube are simultaneously released to the exhaust 139, thus mixing and diluting hydrogen with nitrogen through exhaust vent-line 157. In at least one embodiment of the present invention, the hydrogen diluted by the shell nitrogen moves to the dilution tank 151 via the double-walled exhaust line 157 and it is further diluted there. Some embodiments also include a burning scrubber 152, which is connected to the dilution tank via another double-walled stainless steel line 158, and the hydrogen or other inflammable exhaust gas is burned before its released into the atmosphere, as indicated by the arrow 159 in the figure. The exhaust vent line 157 is prone to have water condensation inside the line, particularly if a scrubber is not used, due to the back streaming of cold air from the atmosphere. The water condensation could react with hydrogen at high temperature, potentially resulting in a hazardous situation. In order to prevent the water condensation and also to further dilute the venting hydrogen/deuterium or other processing gas, additional nitrogen is injected in the exhaust vent line thereby providing the same function as injection line 56 of FIG. 2A. Nitrogen injection line 161 is connected to the exhaust vent line immediately after the exhaust vent valve, and a small amount of nitrogen flow is maintained in order to prevent any water condensation in the vent line. In some embodiments, the nitrogen flow is increased during the chamber depressurization in order to further dilute the venting hydrogen/deuterium gas.

The exemplary system of FIG. 2B also comprises the incoming gas delivery and control subsystem, which is one of the most unsafe areas in the system due to the presence of high concentration, high pressure processing gas. The exemplary gas delivery and control subsystem shown in the figure comprises a high pressure hydrogen canister 155, or a booster pump, and hydrogen/deuterium gas cabinet 153. The incoming hydrogen or deuterium gas can be 100% in concentration, and its pressure is typically no less than 700 PSI. The gas from the canister, indicated by the arrow 160 in the figure, flows into the gas cabinet 153 through a hydrogen/deuterium gas line 156. In some embodiments, the gas line uses double-walled stainless steel pipes. In the exemplary embodiment shown in the figure, the gas cabinet 153 is sealed, or protected, by high pressure nitrogen environment or light vacuum environment. It is also separated from other gas panels, e.g. 154, to ensure safety. According to an embodiment of the present invention, a hydrogen/deuterium detector is installed inside the control cabinet, and the control cabinet is also connected to exhaust lines which lead to the dilution tank 151. When any hydrogen leak is detected inside the control cabinet, the exhaust will be open, and an alarm will sound and the source gas line will be shut off.

Figure 3:
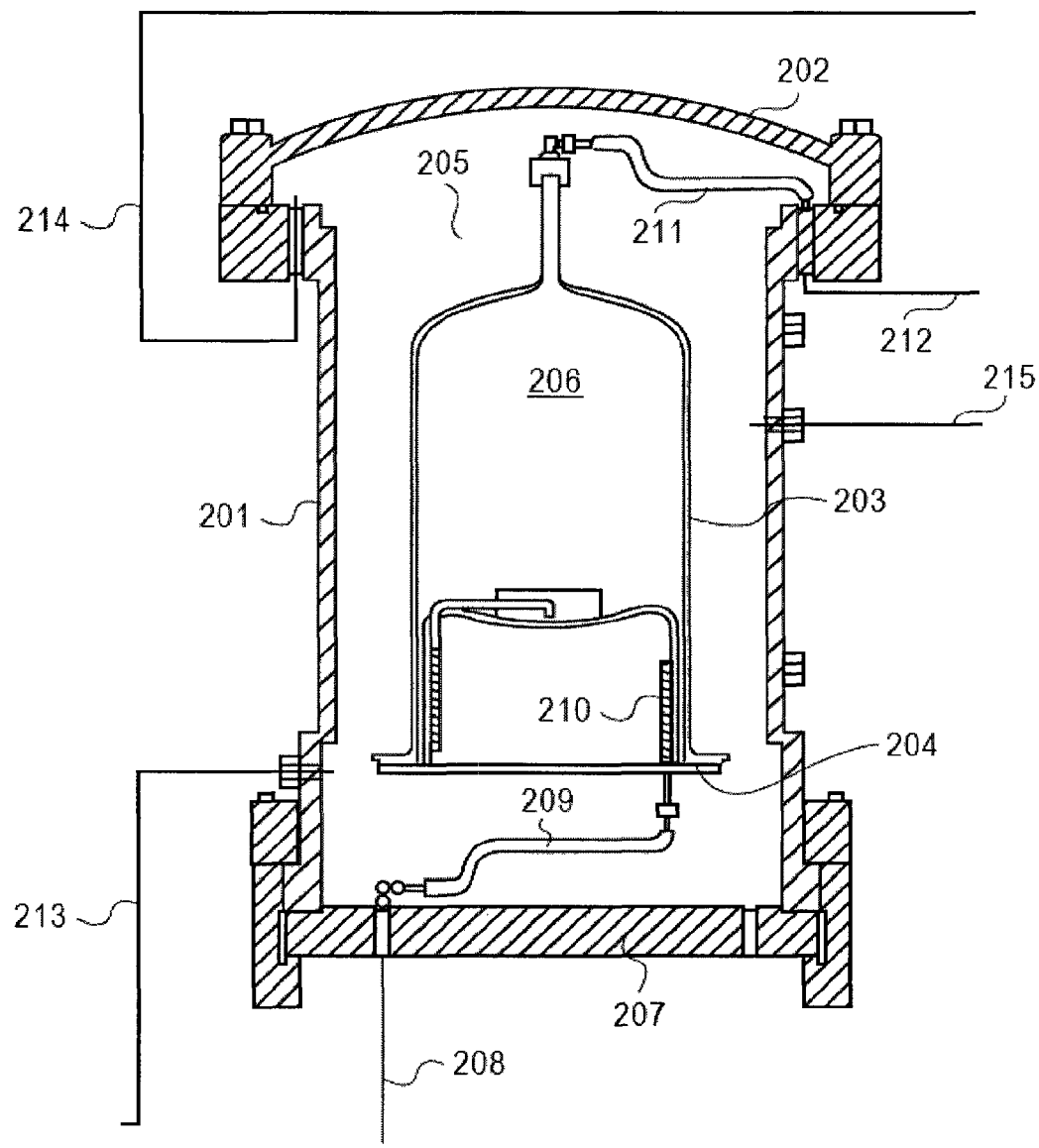
FIG. 3 illustrates an exemplary dual chamber vessel used in an embodiment of the present invention, which comprises the inner chamber and the outer chamber. The vessel has two separate compartments separated by the inner chamber.

Turning now to FIG. 3, a cross-sectional view of a dual chamber processing vessel according to an embodiment of the present invention is shown. The vessel comprises an inner chamber 203 and an outer chamber 201 similar to the design of the exemplary vessel shown in FIG. 2A. In a dual chamber design, a reactive gas, which may be inflammable, toxic, or otherwise dangerous, is confined in the inner chamber, 206 in the figure, and the inner chamber is then protected by the external pressure exerted by another gas contained in the outer chamber, 205. In some embodiments, inert gas such as nitrogen is used in the outer chamber. It should be noted that various parts, including the support that holds the inner chamber inside the outer chamber, are not shown in the figure for the sake of clarity. As stated earlier, this dual chamber design provides a buffer layer in case there is a leakage of the processing gas from the inner chamber. In the embodiment shown in the figure, the inner and outer chambers are sealed by covers or doors, 204 and 202/207, respectively. According to at least one embodiment of the present invention, the outer chamber is made of metals such as type 316 stainless steel, which has one of the highest stress points for high pressure, and the inner chamber is made of non-metallic material such as quartz to reduce contamination in high-temperature and high-pressure operating environment.

FIG. 3 also shows various gas injection and venting lines. Note that these gas pipes are drawn schematically as lines in the figure. The figure also shows a cooling water line 214. Processing gas such as $H_2$ or $D_2$ is injected through 208, 209, and 210, and exhausted through 211 and 212. The outer chamber gas such as $N_2$, on the other hand, flows in to the vessel through gas line 213 and it is vented through 215. In some embodiments, these gas lines may be reused for other purposes. For example, during loading and unloading, the hydrogen gas lines 208, 209, and 210, as well as the nitrogen line 213, may be used to flow nitrogen to purge any residual processing gas left in the vessel.

Figure 4:
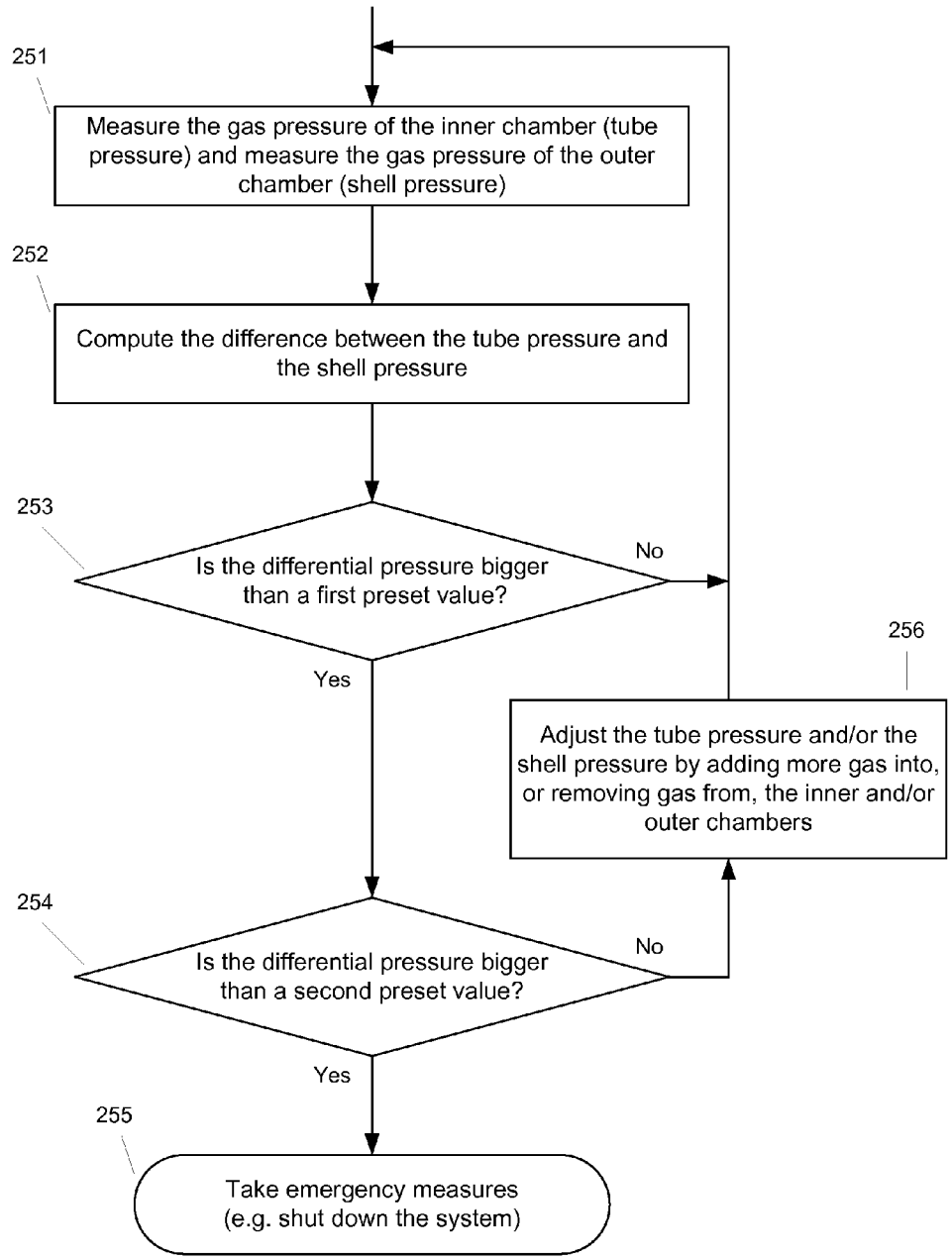
FIG. 4 is a flow chart illustrating an exemplary process used in an embodiment of the present invention to protect the inner chamber. If the differential pressure becomes larger than a certain preset value, the system automatically adjusts the pressures.

In the dual chamber design, the pressure difference between the inner and outer chambers, 206 and 205 of FIG. 3, respectively, translates into a pressure force onto the surface of the inner chamber wall 203. Inner chambers made of certain materials such as quartz can collapse or break under high pressure differences. In some embodiments of the present invention, the pressures of the gases in the inner and outer chambers are maintained within a predetermined range. For example, when the pressure of the gas in the inner chamber increases, or decreases, the amount of the gas in the outer chamber is increased, or decreased, such that the differential pressure across the inner chamber wall 203 remains in the predetermined range. This is illustrated in the flow chart shown in FIG. 4. In this exemplary process, the differential pressure between the inner and outer chamber is maintained within the predetermined range by operations, 251, 252, 253, 254, and 256, arranged in a loop. The operations may be implemented by a computer which is programmed to read pressure sensors in both chambers and to change one or both pressures to maintain the differential pressure within a desired range. In block 251, the tube pressure and the shell pressure are measured, and in block 252, the differential pressure is computed. If the differential pressure is within a preset limit, as indicated by the No branch at block 253, these measurement operations are repeated, either periodically or based on other events. If a differential pressure higher than the preset value is detected, but if the pressure value is less than another critical value which is higher than the first preset value, then, following the Yes branch at block 253 and the No branch at block 254, an operation shown in block 256 is performed. In this example, the pressure difference is adjusted by adding or removing gases to or from either chamber. Then the process starts again starting from block 251. If the differential pressure is higher than the second critical value, as indicated by the Yes branch at block 254, this exemplary process terminates, for example, by shutting down the system and taking any necessary safety measures, as indicated by block 255.

As stated earlier, a level of differential pressure tolerance would be around 2 atm in a typical design of dual chamber vessels, such as those shown in FIG. 2A or 2B. The shell pressure comparable, or substantially close, to the tube pressure will maintain the integrity of the inner chamber, which is made of materials like quartz in some embodiments. Under carefully calibrated conditions, where the differential pressure remains below a critical value, the hydrogen or deuterium gas in the inner chamber is isolated from the atmosphere by large quantity of nitrogen all around the tube area, thus preventing any exposure of hydrogen to the atmospheric air during the high pressure processing. Any hydrogen leak from the tube will be diluted instantaneously by the surrounding nitrogen in the shell. As indicated in block 255 of FIG. 4, however, if the leak is large enough to cause the differential pressure to grow beyond a preset critical value, the high pressure process is aborted by the software interlock in some embodiments. In cases when the gas from the outer chamber leaks either into the inner chamber or to the outside atmosphere, a similar precaution is taken, and the interlock aborts the high pressure operation when the differential pressure reaches the critical value. In some embodiments, not only the differential pressure but also both the tube and shell pressures are monitored to detect any possible malfunctions in the system. When both the shell pressure and the tube pressure are simultaneously dropping, or when the quartz tube separating the tube pressure and the shell pressure collapses due to the pressure differential malfunctioning, both the mechanical and software interlocks will shut down the high pressure operation, and the pressure release valve opens immediately to evacuate both chambers.

Figure 5:
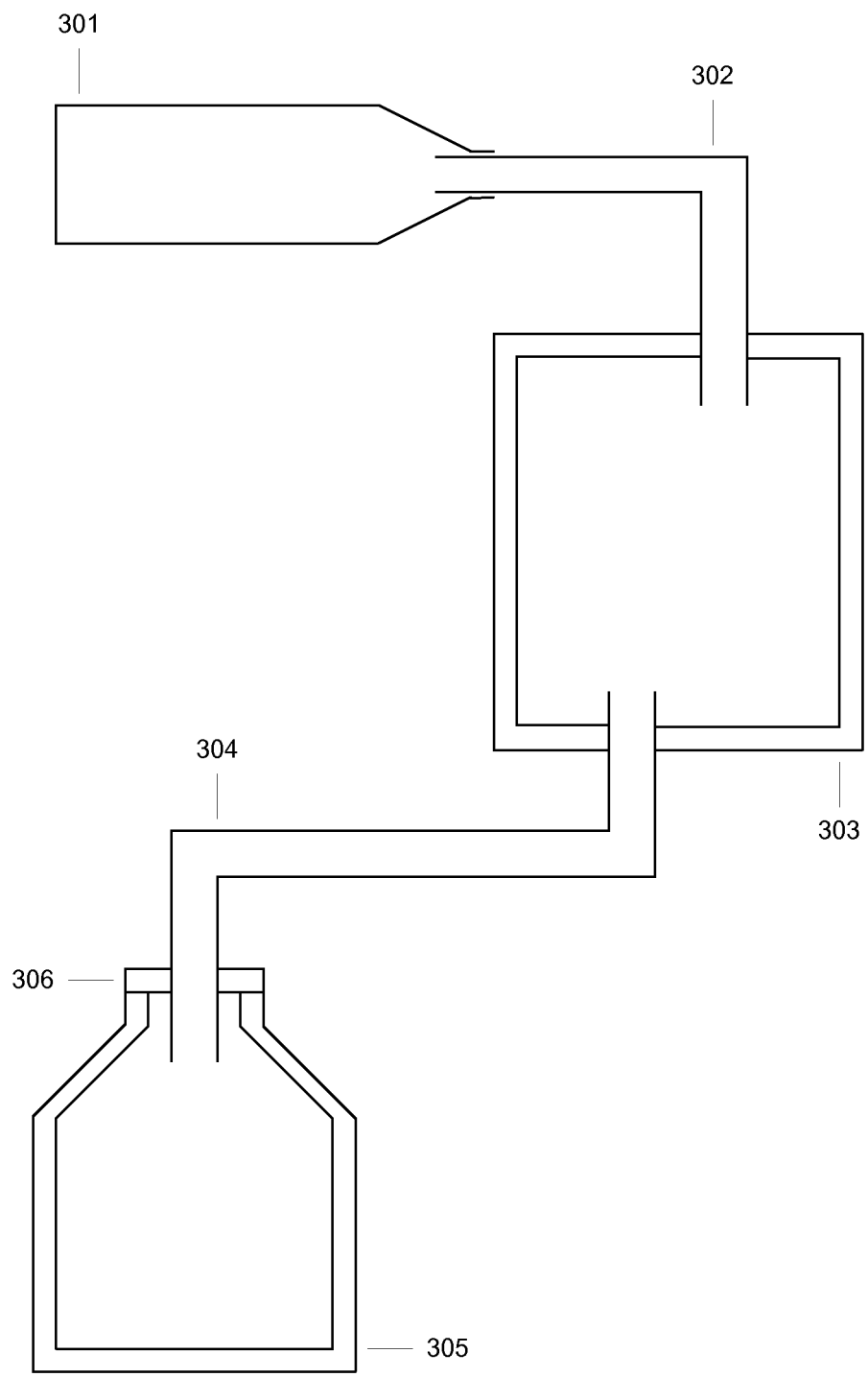
FIG. 5 shows an exemplary incoming gas delivery system in an embodiment of the present invention. The figure shows three components: A processing chamber, a gas canister, and a gas control compartment.

In some embodiments of the present invention, a safe incoming gas injection, delivery, and control subsystem is provided, where flow-meters, mass-flow controllers, and other gas control mechanisms are connected. According to at least one embodiment, the connection joints between these units are protected by additional compartments or chambers. An exemplary system is schematically shown in FIG. 5, which comprises a gas canister 301, a processing chamber 305, and a gas control panel 303. The gas canister and the gas control panel are connected via a gas pipe 302, and the gas from the gas control panel flow into the processing chamber through a gas line 304. In some embodiments, the gas pipe is protected by double wall construction, as described earlier. The minimum pressure of a gas canister or a booster pump is typically 700 PSI, and this incoming gas delivery system is one of the weakest links in ensuring safety in high pressure systems. The hydrogen gas lines, 302 and 304, are connected to various gas control mechanisms such as mass-flow controller or flow meters (not shown in the figure), typically contained in the gas control panel 303, in order to control the flow. In some embodiments, the gas control panel is protected using additional mechanisms, for example, under pressurized nitrogen environment or under light vacuum environment. This prevents any hydrogen from leaking directly into the atmosphere. In some embodiments, a warning or alarm system is utilized to detect any gas leakage from the gas control panel or from any components, including the gas injection pipes. When any hydrogen leak is detected inside or around the control panel, the exhaust will be open, and an alarm will sound and the source gas line will be shut off. In certain embodiments, the gas control panel is connected to an exhaust gas dilution tank, and the source gas can be directly exhausted bypassing the processing chamber in case of emergency.

Another area of potential hydrogen exposure to the atmosphere is the load zone of the process vessel. When the breech door lock, 306 in FIG. 5, unlocks the door and the vessel door is open after the process is completed, there is a potential that some trapped residual hydrogen can be released into the atmosphere. In order to minimize any potential risk of hydrogen exposure, the load zone is configured with nitrogen laminar flow in some embodiments, as explained earlier, for example, with respect to FIG. 3. The nitrogen flows into the dilution tank, thus evacuating any hydrogen residue to the dilution tank. In some embodiments, the load zone is also equipped with hydrogen sensors in order to monitor any hydrogen leaks, and any hydrogen leak above a safety level will trigger emergency measures, possibly including system shutdown.

Figure 6:
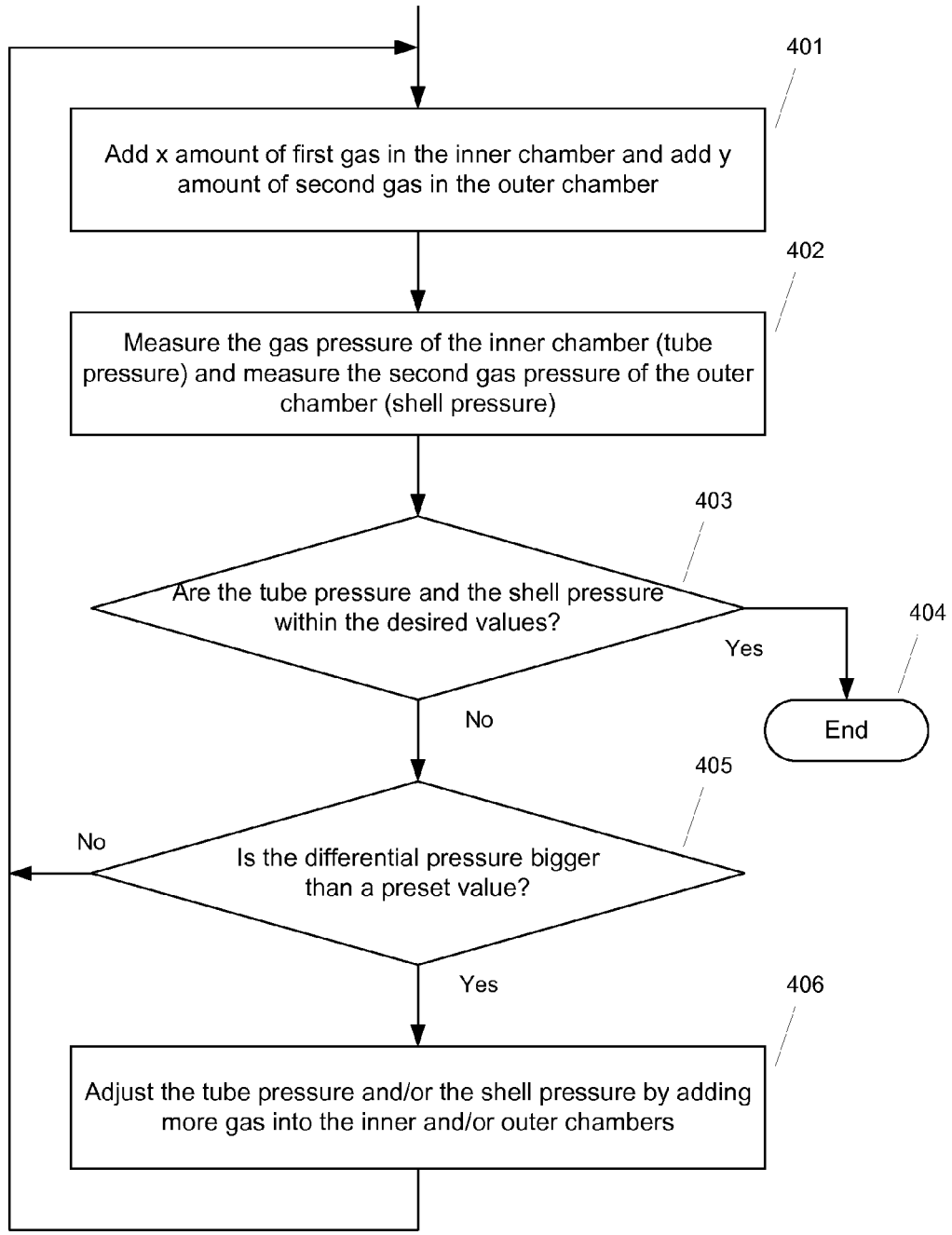
FIG. 6 is a flow chart illustrating an exemplary method for increasing/decreasing pressures of inner and outer chambers simultaneously, according to an embodiment of the present invention.

FIG. 6 illustrates an exemplary process for pressurizing the processing vessel according to an embodiment of the present invention, which utilizes a dual chamber vessel. When pressurizing the dual chambers, the pressure increases in the inner chamber and the outer chamber should be carefully controlled. Normally, the differential pressure should remain under a preset value, for example, 2 atm. The flow chart shown in the figure describes the pressurizing process in discrete lock-steps, which form a loop comprising blocks 401, 402, 403, 405, and 406. However, in other embodiments, these operations can be performed continuously. The exemplary process of FIG. 6 starts by adding certain amount, x, of the first gas (the processing gas in the inner chamber) and certain amount, y, of the second gas (inert gas in the outer chamber) into the respective chambers, as shown in block 401. In a typical design, the volume of the outer chamber is much larger than that of the inner chamber, and hence the proportionally larger amount of the second gas should be injected to equalize the pressures. These amounts, x and y, are generally computable quantities based on a particular design of the vessel. The amount of injection can be controlled by various ways, for example, using injection pipes with different diameters or varying the injection time. Then, the tube pressure and shell pressure are measured, 402, and the differential pressure is computed, 405. If both the shell pressure and the tube pressure are substantially close to the target values, the process terminates at 404. Otherwise, the process continues. If the differential pressure remains under the acceptable range, then the pressurizing process continues following the No branch at block 405. Otherwise, some additional operations are taken, at 406, to balance the shell and tube pressures.

Figure 7:
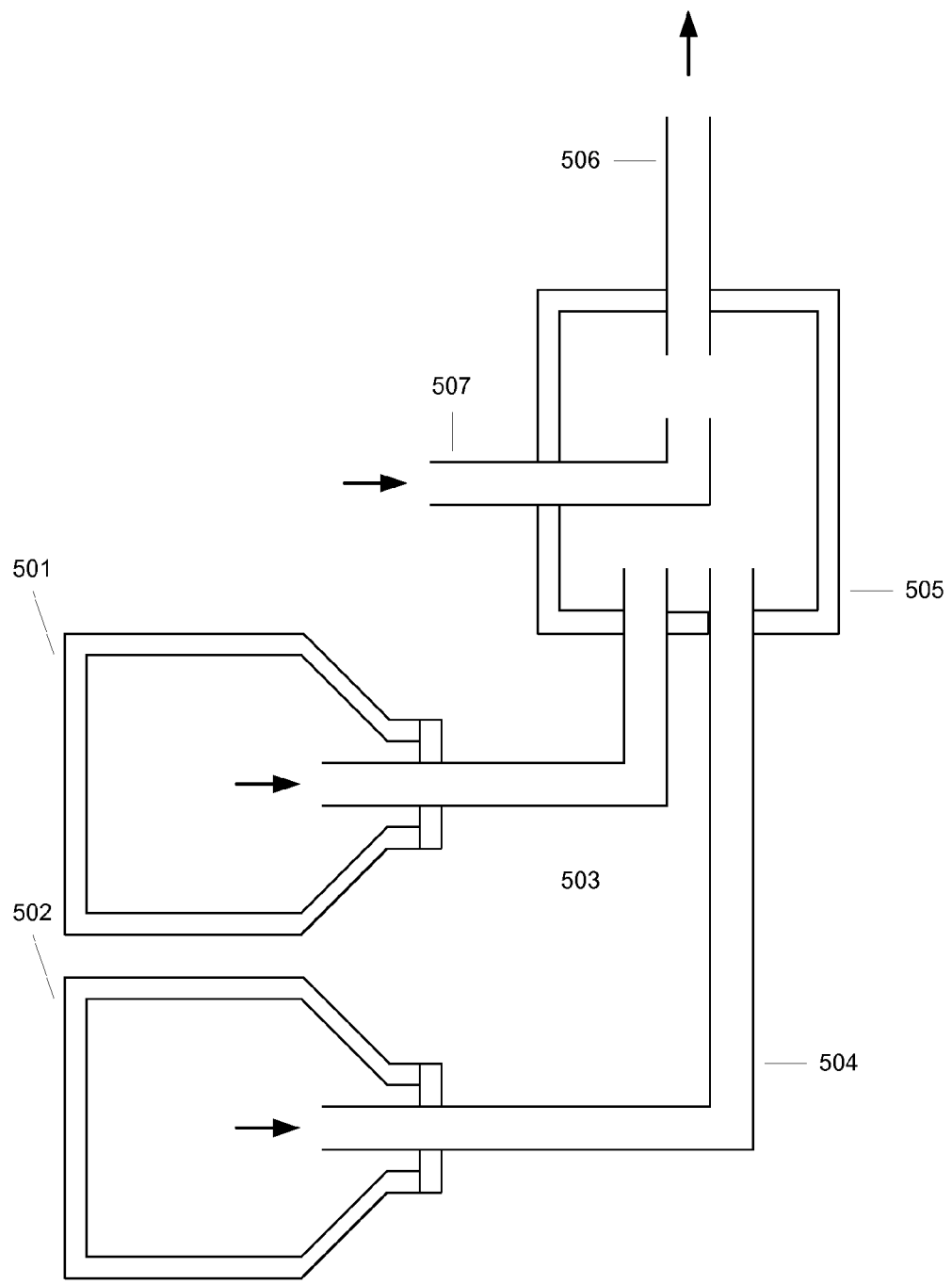
FIG. 7 illustrates an exemplary exhaust/venting system used in an embodiment of the present invention. The system includes extra gas lines for preventing back-streaming of atmospheric air through the exhaust pipe.

Referring now to FIG. 7, an exemplary venting system is illustrated according to an embodiment of the present invention. The pressurized hydrogen or other toxic gas is released into the atmosphere through the venting system after the annealing process is completed. This schematic figure shows two processing chambers, 501 and 502, which are connected to depressurizing exhaust pipes, 503 and 504, respectively. The figure also shows an additional compartment or mixing tank 505, which is directly connected to the pipes, 503 and 504. According to this exemplary embodiment, the gas from the first chamber 501 is released at the same time and mixed with the gas from the second chamber 502 in the mixing tank. In cases where one of the gases is toxic, inflammable, or otherwise dangerous in high concentration or under high pressure, this mechanism dilutes the dangerous gas with the gas from the other chamber. This has been, for example, illustrated related to the embodiments shown in FIGS. 2A and 2B. The mixed, or diluted, gas then flows out of the mixing chamber 505 through another pipe 506, which may be connected to other mixing or dilution tanks or burning scrubbers. In some embodiments, the pipes 503 and 504 may be very short, or they may not be present at all, and the gas chambers may be directly connected to a mixing compartment, thereby increasing the effectiveness of mixing. In certain embodiments, the exhaust valves (not shown in the figure), which open and close the exhaust pipes from the chambers, are controlled together, and relative amount of venting gases is automatically set based on their relative pressures. They may also depend on the relative sizes of their respective chambers and the relative sizes of the pipe diameters. In certain other embodiments, the exhaust valves may be independently controlled so that the amount of the exhaust gas from each chamber can be independently adjusted. In the latter case, the relative concentration of the exhaust gas may be controlled in the mixing tank 505 under high pressure conditions.

According to at least one embodiment, other inert gas such as nitrogen is added during the venting process thereby reducing the concentration of the reactive gas from the annealing vessel. As shown in FIG. 7, an extra gas pipe 507 is included in the mixing tank 505 in this exemplary embodiment. The added gas such as nitrogen further decreases the concentration of the toxic or dangerous gas such as hydrogen. This added gas flow also prevents back flow of gas from outside, e.g. through the exhaust venting pipe 506. As stated earlier, the back streaming of gas or air from outside can have an adverse effect on the venting system, for example, by providing oxygen to the exhaust gas. In some embodiments, the amount of gas flow through this pipe 507 is automatically adjusted based on the amount, or the pressure, of the exhaust gas coming from the pipes 503 and 504.

Figure 8:
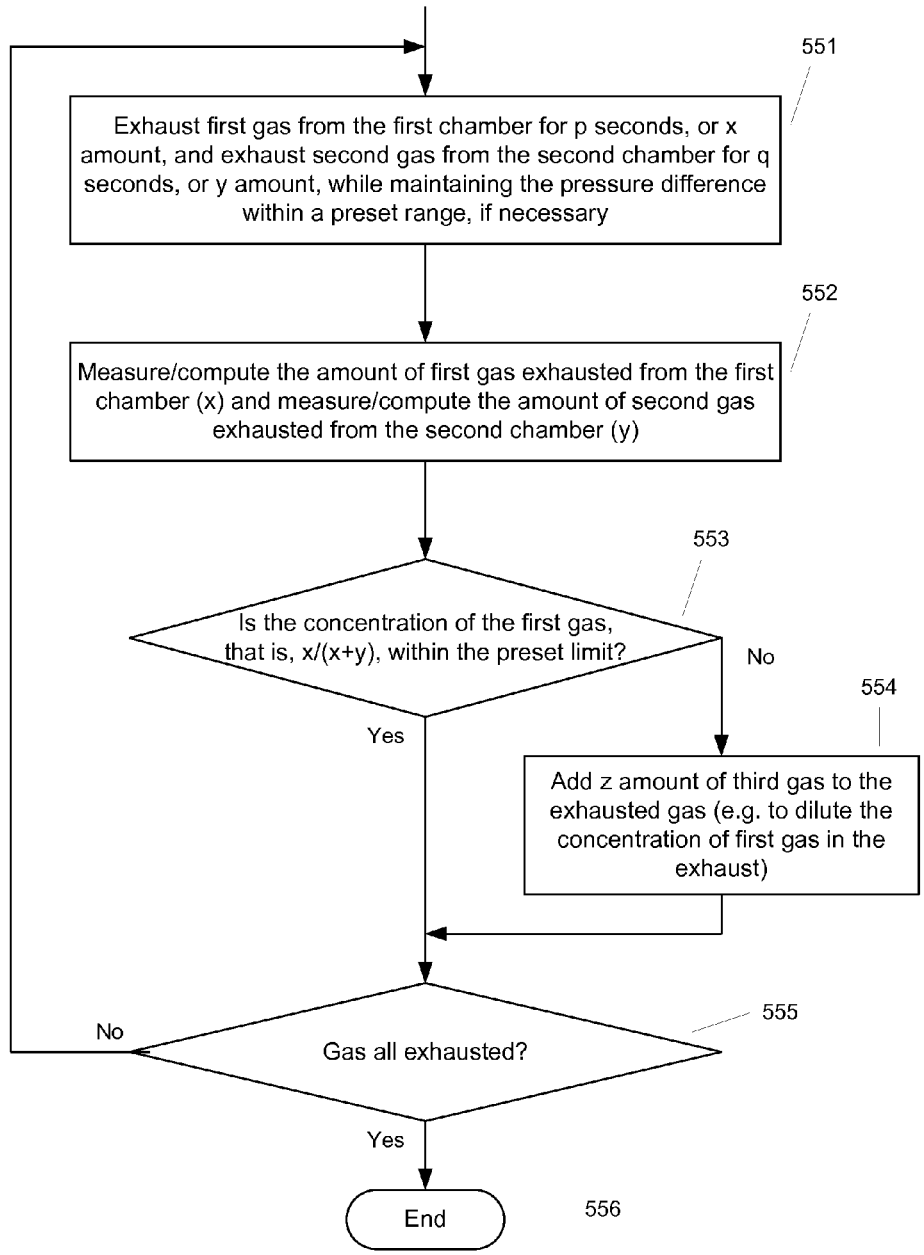
FIG. 8 shows a flow chart illustrating a method according to an embodiment of the present invention for venting gases from multiple chambers at the same time. In this method, the processing gas from one chamber is mixed with the gas from the other chamber during the venting process.

FIG. 8 illustrates an exemplary process for venting the exhaust gas from a two-chamber annealing vessel according to an embodiment of the present invention. The vessel comprises a first and a second chambers, for example, as in the system shown in FIG. 7, and it is assumed that the first chamber contains processing gas, whose concentration needs to be monitored for safety reasons. The flow chart shows a segment of the process after the annealing has been done and the venting operation has started. In block 551, controlled amount of the gases from both chambers are released, either at the same time or one after another. As noted in the block, the pressure of each chamber needs to be monitored in some cases to ensure safety. For example, in the dual-chamber design shown in FIG. 3, the differential pressure needs to be within a preset range at all times. Then, the concentration of the first gas in the exhaust gas is measured or computed at block 552. If the concentration of the dangerous gas is within an acceptable range, as indicated by the Yes branch at block 553, the venting process continues following block 555. Otherwise, additional operation is performed to change the first gas concentration. As shown in block 554, this can be done either by adding additional amount of inert gas into a mixing chamber, for example, or by controlling the exhaust amount from each chamber in the next cycle of operations. If the gas has been completely exhausted, or if the pressure level goes below a certain preset value, then following the yes branch at block 555, this exemplary venting process stops at 556.

After the process is completed, or otherwise terminated, and the gases are depressurized, there may remain some residual gas trapped in the annealing chamber or in any of the subsystems. The residual gas trapped can eventually leak and/or interact with the atmospheric air creating potentially dangerous situation. There is also a strong possibility of trapping the atmospheric air inside the process vessel when the vessel door is closed, and this may cause an interaction with the processing gas such as hydrogen when the pressurization starts. According to at least one embodiment of the present invention, a nitrogen purging process is employed at the beginning of the process after the vessel door is closed and prior to beginning of the hydrogen pressurization, which removes any residue gases or air trapped in various parts of the annealing system. The nitrogen purging process may also be used at the end of the process prior to opening the vessel door in order to purge any trapped hydrogen in the gas chambers. In some embodiments, nitrogen laminar flow is maintained near, or around, the exhaust valves or pipes of the annealing vessel to help remove any residual gas remaining in the system after the process is completed.

Thus, methods and apparatuses for annealing semiconductor devices in a high pressure gas environment have been provided. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A non-transitory computer readable medium comprising instructions which when executed by a computer of a high pressure annealing apparatus cause the computer to execute a method of annealing a plurality of substrates in a semiconductor manufacturing process, the method comprising:

performing a pressurization of an inner chamber of the high pressure annealing apparatus, the inner chamber configured to contain a first gas at a first pressure above atmospheric pressure and the inner chamber having walls which define a concave interior surface at one end of the inner chamber, wherein the first gas is reactive to oxygen or atmospheric air at the first pressure;

performing a pressurization of an outer chamber of the high pressure annealing apparatus, the outer chamber configured to contain a second gas at a second pressure above atmospheric pressure, and wherein the outer chamber encompasses and surrounds the inner chamber, and wherein the second gas is inert to the first gas, wherein pressurizing of the inner chamber and the outer chamber creates an environment configured in the inner chamber and the outer chamber by confining the first gas in a buffer of the second gas so as to reduce or minimize the possibility of leakage or exposure of the first gas to oxygen or atmospheric air;

controlling a gas control system of the high pressure annealing apparatus, the gas control system coupled to the inner and outer chambers, wherein the gas control system is configured to automatically control and maintain a differential pressure between the second pressure of the second gas in the outer chamber and the first pressure of the first gas in the inner chamber;

controlling an incoming gas flow control system of the high pressure annealing apparatus, the incoming gas flow control system comprising a gas control cabinet coupled to the inner chamber and for providing the first gas to the inner chamber, wherein the gas control cabinet is sealed; and controlling a gas exhaust control system of the high pressure annealing apparatus, the gas exhaust control system coupled to the inner and outer chambers, wherein the exhaust of reactive gases from the inner chamber is diluted with an inert gas in a contained environment in order to reduce a hazardous nature of the reactive gases from the inner chamber, prior to the release of the reactive gases to the atmosphere, wherein the plurality of substrates are loaded into the inner chamber, and the pressurization of the first gas of the high pressure annealing apparatus is performed until the first pressure in the inner chamber is greater than normal atmospheric pressure, and wherein the second pressure is greater than the first pressure, and wherein the differential pressure between the first and second gasses is within a preset differential range, and wherein prior to introducing the first gas into the inner chamber:

performing a purge in the inner chamber, so as to completely purge atmospheric gas in the inner chamber, and thereafter injecting the first gas into the inner chamber and the second gas into the outer chamber, wherein the amount of first and second gases injected into the first and second chambers, respectively, are automatically controlled during the pressurization by repeatedly performing a method for increasing the first and second pressures of the inner and outer chambers while maintaining the differential pressure within a preset differential range, and wherein the plurality of substrates are annealed in a safe reactive gas environment within the inner chamber while reducing or minimizing the possibility of leakage or exposure of the first gas to oxygen or atmospheric air, wherein the safe reactive gas environment comprises:

a processing gas environment comprising the first gas with the first pressure in excess of normal atmospheric pressure, wherein the first gas comprises at least one gas from the group consisting of hydrogen, deuterium, fluorine, chlorine, and ammonium, and an inert gas environment within the outer chamber and external to the inner chamber comprising the second gas at the second pressure, wherein the differential pressure between the second pressure and the first pressure is maintained such that the second pressure is greater than the first pressure, and wherein the processing gas environment is confined with a buffer of inert gas at a higher pressure so as to reduce or minimize the possibility of leakage or exposure of the processing gas to atmospheric air or oxygen; and performing a depressurization of the high pressure annealing apparatus, after the annealing operation, to reduce the first pressure in the inner chamber, wherein the depressurization comprises:

exhausting the processing gas from the inner chamber while exhausting inert gas from the outer chamber, so as to reduce the first and second pressures while automatically maintaining the second pressure greater than the first pressure and the differential pressure within the preset differential range, diluting the exhausted processing gases from the inner chamber with an inert gas, performing, after the exhausting, a purge in the inner chamber by introducing an inert gas into the inner chamber to remove any residual processing gas, and removing, after the purging, the plurality of substrates from the inner chamber.

2. The non-transitory computer readable medium of claim 1, wherein the method of increasing the first and second pressures of the inner and outer chambers further comprises:

measuring the first and second pressures;

determining if the first pressure is in excess of normal atmospheric pressure;

determining if the second pressure is greater than the first pressure, and if the differential pressure between the second pressure and the first pressure is within a preset differential range, wherein the preset differential range is less than 2 atmospheres;

calculating the amount of first and/or second gas to be injected into the first and second chambers so that the second pressure would be greater than the first pressure and wherein the differential pressure would be within a preset range; and adjusting the amount of first and/or second gas injected into the first and second chambers to reflect said calculation of amounts of first and/or second gas injected.

3. The non-transitory machine readable medium of claim 2, wherein the adjusting of the first gas injected and the adjusting of the second gas injected are separately controlled.

4. The non-transitory machine readable medium of claim 3, wherein the reduction of the first and second pressures while automatically maintaining the second pressure greater than the first pressure and the differential pressure within the preset differential range further comprises:

measuring the first and second pressures;

determining if the second pressure is greater than the first pressure, and if the differential pressure between the second pressure and the first pressure is within a preset differential range, wherein the preset differential range is less than 2 atmospheres;

calculating the amount of the first and second gases to be vented from the first and second chambers so that the second pressure would be greater than the first pressure and wherein the differential pressure would be within a preset range; and adjusting the amount of first and/or second gas vented from the first and second chambers to reflect said calculation of amounts of first and/or second gases to be exhausted.

5. The non-transitory machine readable medium of claim 4, wherein the adjusting of the amount of venting of the first gas and the adjusting of the amount of venting of the second gas are separately controlled.

6. The non-transitory machine readable medium of claim 1, wherein the diluting of the exhausted processing gases from the inner chamber is performed by mixing the exhausted processing gases with the exhausted inert gases from the outer chamber.

7. The non-transitory machine readable medium of claim 6, further comprises injecting an additional inert gas into the mixture of exhausted processing and inert gases.

8. The non-transitory machine readable medium of claim 1, wherein the processing gas environment comprises one of up to 100% hydrogen, up to 100% deuterium, or a combination thereof.

9. The non-transitory machine readable medium of claim 1, wherein the second gas comprises an inert gas selected from the group consisting of nitrogen, helium, argon, and any combination thereof.

10. The non-transitory machine readable medium of claim 5, wherein the method of annealing a plurality of substrates comprises a method of operating the high pressure annealing apparatus, wherein the method of operating the high pressure annealing apparatus comprises a method of reducing risks of exposing or releasing a processing gas from a high pressure wafer annealing apparatus to oxygen or directly into the atmosphere.

11. The non-transitory machine readable medium of claim 10, wherein the method of operating the high pressure annealing apparatus comprises protecting the inner chamber at the first pressure, by automatically controlling the second pressure in the outer chamber enclosing the inner chamber, wherein said controlling comprises adding second gas into said second pressure chamber so that the difference between the second pressure of said second gas and the first pressure of said first gas is substantially within the preset differential range, wherein the second pressure is greater than the first pressure; and further performing an emergency measure if the pressure difference is outside the preset differential range.

12. The non-transitory machine readable medium of claim 11, wherein the controlling further comprises adding, in a first mode, the first gas into the inner chamber, and venting, in a second mode, the first gas from the inner chamber, so as to adjust the first pressure.

13. The non-transitory machine readable medium of claim 6, wherein the mixing of exhaust reactive gases and exhaust inert gases comprises mixing in a dilution chamber, said dilution chamber is coupled to a first exhaust pipe, which exhausts the first gas from the inner chamber, and said dilution chamber is coupled to a second exhaust pipe, which exhausts the second gas from the outer chamber, wherein said first gas and said second gas is mixed in said dilution chamber and the mixed gas is further exhausted in a third exhaust pipe coupled to the dilution chamber.

14. The non-transitory machine readable medium of claim 6, wherein the exhausted processing gases comprises hydrogen from the inner chamber, and wherein the exhausted inert gases comprises nitrogen from the outer chamber.

15. The non-transitory machine readable medium of claim 1, wherein the gas control cabinet comprises components inside the cabinet, which are protected by an inert environment within the cabinet selected from the group consisting of: a light vacuum environment, and a nitrogen gas under light vacuum environment.

16. The non-transitory machine readable medium of claim 1, wherein the apparatus is capable of safely performing a high pressure anneal with the first gas at a high pressure greater than normal atmospheric pressure and less that 100 atmospheres.

17. The non-transitory machine readable medium of claim 1, wherein the gas control cabinet is connected to exhaust lines, where in the event of a hydrogen/deuterium leak that is detected inside the gas control cabinet, the source gas line supplying the first gas is shut off.

18. The non-transitory machine readable medium of claim 5, wherein the inner chamber is fabricated from quartz.

19. The non-transitory machine readable medium of claim 1, wherein the incoming gas flow control system further comprises hydrogen and/or deuterium sensors inside the gas control cabinet in order to detect any leak of the first gas from any connections or joints.

20. The non-transitory machine readable medium of claim 1, wherein the semiconductor manufacturing process comprises one or more said anneals selected from the group consisting of: a high-K metal gate dielectric process anneal, a post-metallization sintering anneal, and a forming gas anneal.

21. The non-transitory machine readable medium of claim 1, wherein the inner and outer chambers have volumes, wherein a ratio of the volume of inert gas injected into the outer chamber to the volume of processing gas injected into the inner chamber is related to a ratio of the outer chamber volume to the inner chamber volume.

22. The non-transitory machine readable medium of claim 1, wherein the inner and outer chambers are vertical chambers.

* * * * *